United States Patent
Anderson et al.

(10) Patent No.: US 9,613,955 B1
(45) Date of Patent: Apr. 4, 2017

(54) HYBRID CIRCUIT INCLUDING A TUNNEL FIELD-EFFECT TRANSISTOR

(71) Applicant: International Business Machines Corporation, Armonk, NY (US)

(72) Inventors: Brent A. Anderson, Jericho, VT (US); Tamilmani Ethirajan, Bangalore (IN); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/965,019

(22) Filed: Dec. 10, 2015

(51) Int. Cl.
| | |
|---|---|
| *H01L 29/06* | (2006.01) |
| *H01L 27/088* | (2006.01) |
| *H01L 29/66* | (2006.01) |
| *H01L 29/10* | (2006.01) |
| *H01L 21/8234* | (2006.01) |

(52) U.S. Cl.
CPC .. *H01L 27/0886* (2013.01); *H01L 21/823412* (2013.01); *H01L 21/823431* (2013.01); *H01L 21/823475* (2013.01); *H01L 21/823487* (2013.01); *H01L 29/0657* (2013.01); *H01L 29/105* (2013.01); *H01L 29/66666* (2013.01); *H01L 29/66803* (2013.01); *H01L 29/66977* (2013.01)

(58) Field of Classification Search
CPC ......... H01L 27/0886; H01L 21/823412; H01L 21/823431; H01L 21/823475; H01L 21/823487; H01L 29/0657

USPC ............................................ 257/9, 105, 106
See application file for complete search history.

(56) References Cited

U.S. PATENT DOCUMENTS

| | | | |
|---|---|---|---|
| 6,603,345 B2 | 8/2003 | Takahashi | |
| 8,629,500 B2* | 1/2014 | Holz | ............................ 257/315 |
| 9,026,964 B2 | 5/2015 | Mohanty et al. | |
| 9,087,922 B2* | 7/2015 | Sun | ................. H01L 21/823487 |
| 9,219,063 B2* | 12/2015 | Holz | ............... H01L 21/823418 |
| 2012/0105046 A1 | 5/2012 | Marshall et al. | |
| 2014/0124827 A1* | 5/2014 | Holz | ............... H01L 21/823418 257/105 |
| 2014/0151644 A1 | 6/2014 | Chen et al. | |

(Continued)

OTHER PUBLICATIONS

IBM: List of IBM Patents or Patent Applications Treated as Related (Appendix P), Apr. 6, 2016, pp. 1-2.

(Continued)

*Primary Examiner* — Ori Nadav
(74) *Attorney, Agent, or Firm* — L. Jeffrey Kelly

(57) ABSTRACT

The present invention relates generally to integrated circuits and more particularly, to a structure and method of forming a hybrid circuit including a tunnel field-effect transistor (TFET) and a conventional field effect transistor (FET). Embodiments of the present invention include a hybrid amplifier which features a TFET common-source feeding a common-gate conventional FET (e.g. a MOSFET). A TFET gate may be electrically isolated from an output from a conventional FET. Thus, a high impedance input may be received by a TFET with a high-isolation output (i.e. low capacitance) at a conventional FET. A hybrid circuit amplifier including a TFET and a conventional FET may have a very high input impedance and a low miller capacitance.

6 Claims, 25 Drawing Sheets

(56) References Cited

U.S. PATENT DOCUMENTS

2014/0252442 A1\* 9/2014 Chuang .............. H01L 27/0629
 257/306
2015/0129960 A1 5/2015 Hokazono et al.
2016/0043234 A1\* 2/2016 Alper ................ H01L 29/78648
 327/537

OTHER PUBLICATIONS

Anderson et al., Pending U.S. Appl. No. 15/091,621, filed Apr. 6, 2016, titled "Hybrid Circit Including a Tunnel Field-Effect Transistor," pp. 1-48.
Barboni et al., "TFET-Based Circuit Design Using the Transconductance Generation Efficiency gm /Id Method", Journal of the Electron Devices Society, IEEE Journal of the Year: May 2015, vol. 3, Issue: 3, pp. 208-216.
Sedighi et al., "Analog Circuit Design Using Tunnel-FETs", IEEE Transactions on Circuits and Systems -I: Regular Papers, vol. 62, No. 1, Jan. 2015, 10 pages.
Trivedi et al., "Ultra-low power electronics with Si/Ge tunnel FET", EDAA 2014, 6 pages.
Mishra et al., "Double gate vertical tunnel FET for hybrid CMOS-TFET based low standby power logic circuits", International Conference on Microelectronics, Communication and Renewable Energy, IEEE 2013, 4 pages.
Madan et al., "Asymmetric Tunnel Field-Effect Transistors as Frequency Multipliers", IEEE Electron Device Letters, vol. 33, No. 11, Nov. 2012, 3 pages.
Saripalli et al., "An energy-efficient heterogeneous CMP based on hybrid TFET-CMOS cores", DAC 2011, 6 pages.
Tivedi et al., "Exploring Tunnel-FET for Ultra Low Power Analog Applications: A Case Study on Operational Transconductance Amplifier", DAC'13, May 29-Jun. 7, 2013, Austin, TX, 6 pages.
Liu et al., Steep Switching Tunnel FET: A Promise to Extend the Energy Efficient Roadmap for Post-CMOS Digital and Analog/RF Applications, 2013 IEEE, 6 pages.
Liu et al, "Tunnel FET-Based Ultra-Low Power, Low-Noise Amplifier Design for Bio-signal Acquistion", ISLPED '14, Aug. 11-13, 2014, La Jolla, CA, 6 pages.

\* cited by examiner

HYBRID CIRCUIT INCLUDING A TUNNEL FIELD-EFFECT TRANSISTOR

BACKGROUND

The present invention relates generally to integrated circuits and more particularly, to a structure and method of forming a hybrid circuit including a tunnel field-effect transistor (TFET).

TFETs may have a potential to extend voltage scaling beyond conventional complimentary metal-oxide semiconductors (CMOS), because they can deliver subthreshold swings below a thermodynamic limit imposed on conventional metal-oxide semiconductor field-effect transistors (MOSFETs). TFETs may also present an opportunity to achieve low noise at high input impedance, but suffer from a very high miller capacitance.

SUMMARY

According to an embodiment, a method is disclosed. The method may include forming a hybrid circuit including a tunnel field effect transistor (TFET) and a metal oxide semiconductor field effect transistor (MOSFET). The method may include forming a first fin on an upper surface of a substrate in a first active area. The method may include forming a second fin on an upper surface of the substrate in a second active area. The method may include forming a first gate stack adjacent to a first sidewall of the first fin and a second sidewall of the first fin. The first gate stack may include a first gate dielectric in contact with the first fin, a first gate electrode, and a first spacer adjacent to and contacting an upper surface of the first gate electrode. The method may include forming a second gate stack adjacent to a first sidewall of the second fin and a second sidewall of the second fin. The method may include the second gate stack comprising a second gate dielectric in contact with the second fin, a second gate electrode, and a second spacer adjacent to and contacting an upper surface of the second gate electrode. The method may include forming a first doped layer adjacent to and contacting a sidewall of the first fin. The first doped layer may have an upper surface below a lower surface of the first gate stack. The method may include forming a second doped layer adjacent to and contacting the second fin. The second doped layer having an upper surface below a lower surface of the second gate stack. The method may include forming a third doped layer adjacent to and contacting an upper surface of the first fin. The third doped layer having a lower surface above an upper surface of the first gate stack. The method may include forming a fourth doped layer adjacent to and contacting an upper surface of the second fin. The fourth doped layer may have a lower surface above an upper surface of the second gate stack. At least one of the second doped layer or the fourth doped layer may include a negative dopant. At least one of the second doped layer or the fourth doped layer may include a positive dopant. The first active area may include a MOSFET. The second active area may include a TFET. The MOSFET and the TFET may be electrically connected.

According to an embodiment, a system is disclosed. The system may include a hybrid circuit comprising at least one tunneling field effect transistor (TFET) and at least one metal oxide field effect transistor (MOSFET). The TFET and the MOSFET may be electrically connected.

According to an embodiment, a structure is disclosed. The structure may include a hybrid circuit structure. The hybrid circuit structure may include at least one TFET and at least one MOSFET. The hybrid circuit structure may include an interconnect contacting at least one source/drain of the TFET and at least one source/drain of the MOSFET.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
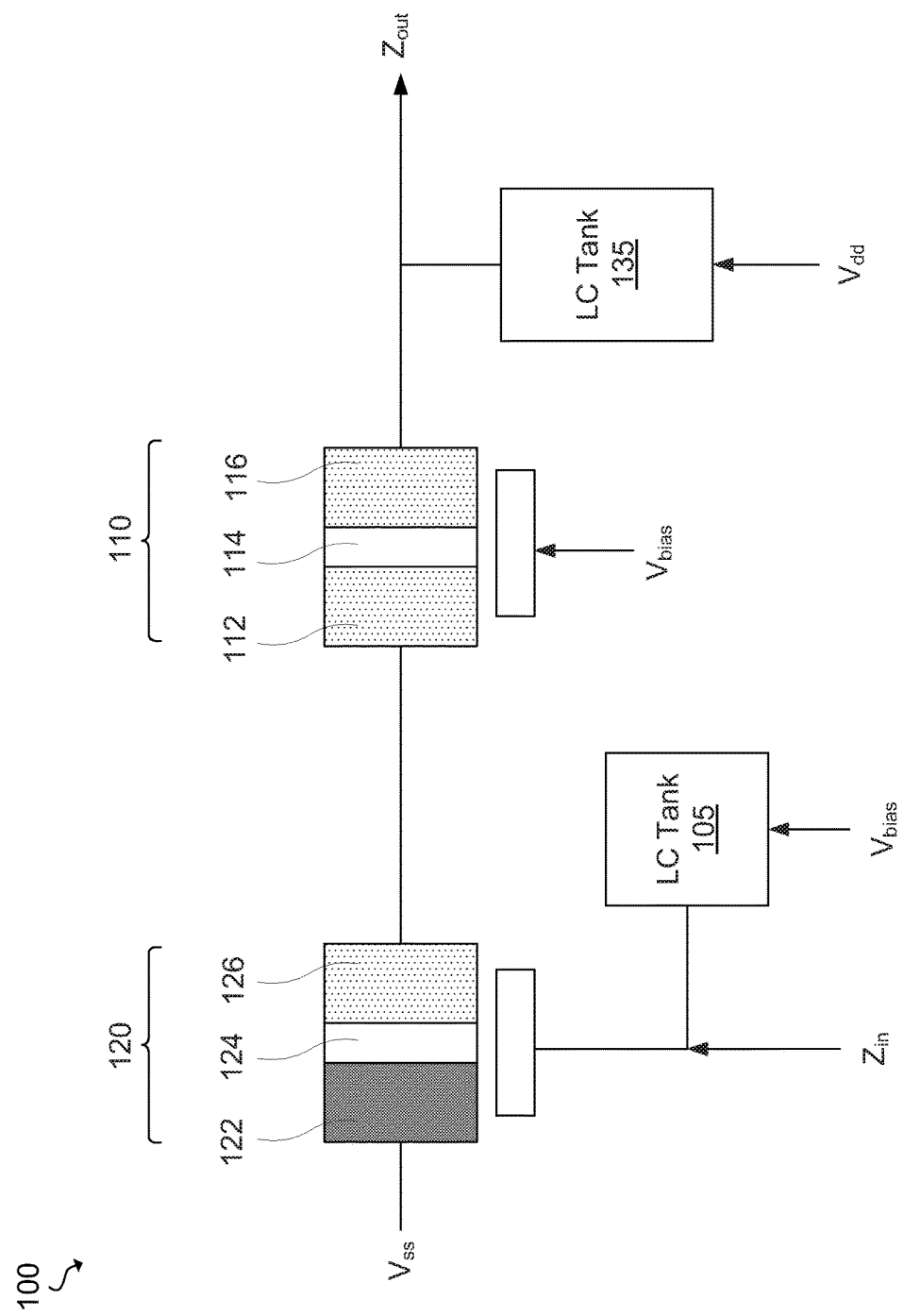
FIGS. 1A-1B illustrate a hybrid circuit, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

The terms "epitaxial growth and/or deposition" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates to a structure and method of forming a TFET with a low miller capacitance. In an embodiment, the hybrid circuit may be used as an amplifier. An amplifier is an electronic device capable of increasing a power of a signal. A typical transistor amplifier has an input stage which accepts an input signal, one or more intermediate stages, and an output stage which delivers an input signal to a load circuit. Energy received from a power supply may be used to increase an amplitude of an input signal. Common active devices in an amplifier may include a bipolar junction transistor (BJT) and/or a metal oxide semiconductor field-effect transistor (MOSFET). Scaling of BJTs and/or MOSFETs may have a thermodynamic limit. For example, MOSFETs with less than a 22 nm gate pitch may have undesirable parasitic effects such as capacitance from a gate to a source-drain and parasitic resistance in the source-drain may severely impact performance. These effects may make a MOSFET alone with less than a 22 nm gate pitch unsuitable for an amplifier. A TFET may have a high input impedance, which is often a desirable property for an amplifier, particularly in radio frequency (RF) applications. However, a TFET may have a large miller capacitance (drain-to-gate capacitance), which may reduce amplitude gain in a signal and cause instability in an amplifier.

Embodiments of the present invention include a hybrid amplifier which features a TFET configured in common-source mode, directly feeding a conventional FET (e.g. a MOSFET) configured in common-gate mode. This common-gate component may isolate a TFET drain-to-gate capacitance from the output, resulting in high impedance input to a TFET and high-isolation common-gate output (i.e. low output capacitance) at a conventional FET. Thus, a hybrid circuit amplifier including a TFET and a conventional FET may have a very high input impedance and a low miller capacitance. Embodiments of a hybrid circuit including a TFET and a conventional FET are not limited to an amplifier application. A hybrid circuit including a TFET and a conventional FET is described below with reference to FIGS. 1A-1B.

Referring now to FIG. 1A, a first hybrid circuit 100 is shown. The first hybrid circuit 100 may include one or more transistors, such as, for example, a FET 110 and a TFET 120. The first hybrid circuit 100 may include one or more resonator devices, such as, for example, an LC Tank 105, an LC Tank 135, or a combination thereof. The hybrid circuit system may have one or more attributes, such as, for example, an input impedance ($Z_{in}$), an output impedance ($Z_{out}$), a negative supply voltage ($V_{ss}$), a positive supply voltage ($V_{dd}$), a bias voltage ($V_{bias}$), or any combination thereof. The bias voltage ($V_{bias}$) may be applied to the first hybrid circuit 100 to allow the transistor(s) to operate in a particular region of its transconductance curve.

The FET 110 may be any conventional transistor known in the art, such as, for example, a MOSFET. The FET 110 may include one or more of a gate, source, drain, source-drain, or any combination thereof. For example, the FET 110 may include a source 112, a body 114, a first gate (not shown), and a drain 116. The first gate may be below the body 114. The source 112 and the drain 116 may comprise any semiconductor material known in the art, including, for example, silicon, germanium, silicon-germanium alloy, silicon carbide, silicon-germanium carbide alloy, and compound (e.g. III-V and II-VI) semiconductor materials. In an embodiment, the source 112 and the drain 116 may include a negative dopant, such as, for example, antimony, phosphorus, arsenic, or any combination thereof. An embodiment of a method of forming the FET 110 is described below with reference to FIGS. 2-24.

The TFET 120 may include one or more of a gate, source, drain, source/drain, or any combination thereof. For example, the TFET 120 may include a source 122, a body 124, a second gate (not shown), and a drain 126. The second gate may be below the body 124. The source 122 and the drain 126 may comprise any semiconductor material known in the art, including, for example, silicon, germanium, silicon-germanium alloy, silicon carbide, silicon-germanium carbide alloy, and compound (e.g. III-V and II-VI) semiconductor materials. In an embodiment, the source 122 may include a positive dopant, such as, for example, boron, aluminium, gallium, or a combination thereof. In an embodiment, the drain 126 may include a negative dopant, such as, for example, antimony, phosphorus, arsenic, or any combination thereof. The TFET 120 may include a high impedance node. The high impedance node may allow a relatively small amount of current through per unit of applied voltage. In an embodiment, the source 122 may be the high impedance node. An embodiment of a method of forming the TFET 120 is described below with reference to FIGS. 2-24.

In an embodiment, a voltage may be applied to the TFET 120 may feed from the TFET 120 to the FET 110. A voltage ($V_{ss}$) may be applied to the source 122 of the TFET 120. Applying the voltage ($V_{ss}$) may result in a miller capacitance (e.g. between the gate 124G and the drain 126). A voltage may be fed from the drain 126 of the TFET 120 to the source 112 of the FET 110. By feeding a voltage from the drain 126 to the source 112, the gate 124G may be isolated from an output of the FET 110. Isolating the gate 124G from an output of the FET 110 may reduce a miller capacitance from the gate 124G on, for example, the drain 116 of the FET 110. Thus, the first hybrid circuit 100 may have a high impedance input at the source 122 of the TFET 120 and also an isolated, low miller capacitance output at the drain 116 of the FET 110.

Figure 1B:
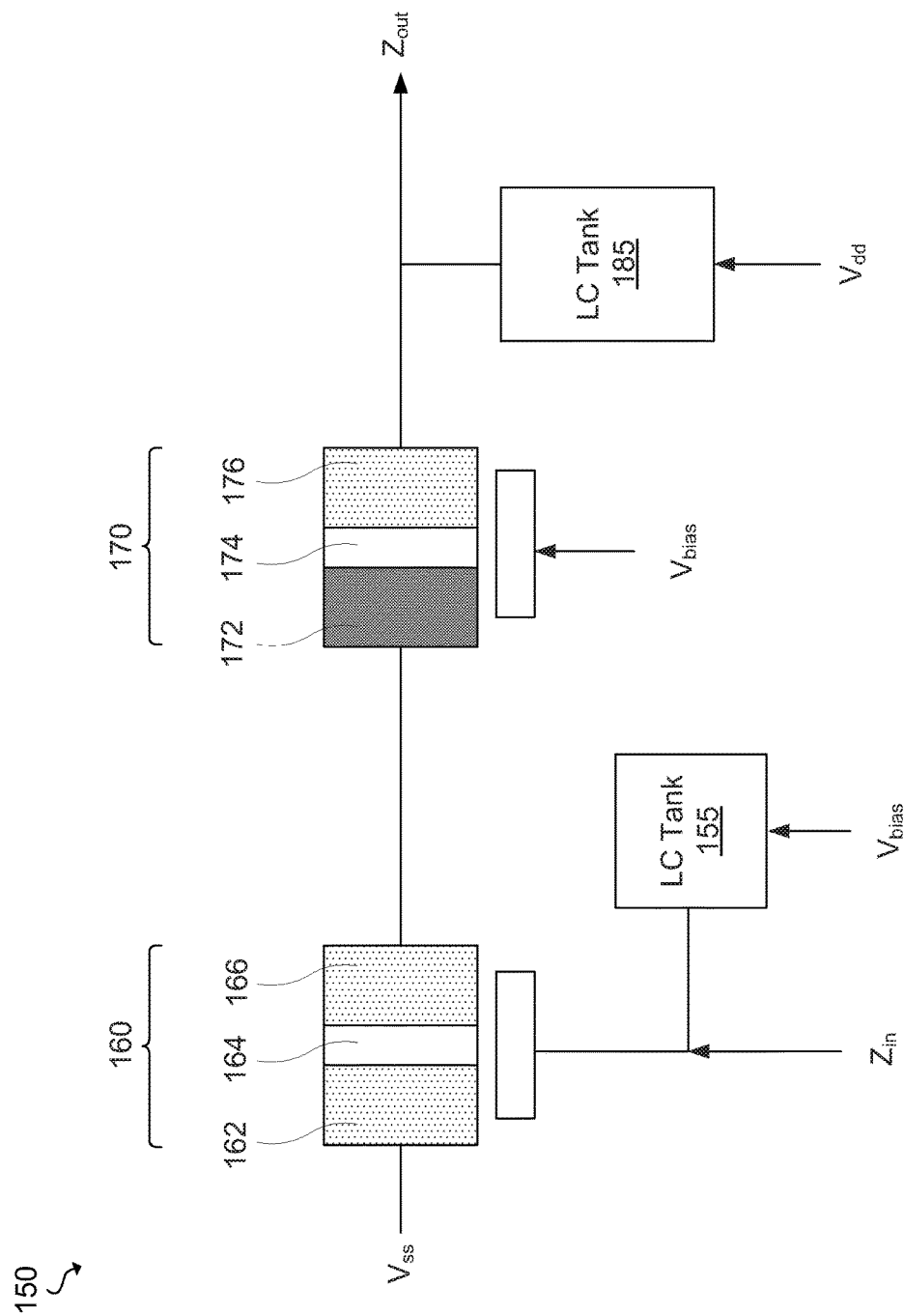

Referring now to FIG. 1B, a second hybrid circuit 150 is shown. The second hybrid circuit 150 may include one or more transistors, such as, for example, a FET 160 and a TFET 170. The second hybrid circuit 150 may include one or more resonator devices, such as, for example, an LC Tank 155, an LC Tank 185, or a combination thereof. The hybrid circuit system may have one or more attributes, such as, for example, an input impedance ($Z_{in}$), an output impedance ($Z_{out}$), a negative supply voltage ($V_{ss}$), a positive supply voltage ($V_{dd}$), a bias voltage ($V_{bias}$), or any combination thereof. The bias voltage ($V_{bias}$) may be applied to the first hybrid circuit 100 to allow the transistor(s) to operate in a particular region of its transconductance curve.

The FET 160 may be any conventional transistor known in the art, such as, for example, a MOSFET. The FET 160 may include one or more of a gate, source, drain, source-drain, or any combination thereof. For example, the FET 160 may include a source 162, body 164, third gate (not shown), and a drain 166. The third gate may be below the body 164. The source 162 and the drain 166 may comprise any semiconductor material known in the art, including, for example, silicon, germanium, silicon-germanium alloy, silicon carbide, silicon-germanium carbide alloy, and compound (e.g. III-V and II-VI) semiconductor materials. In an embodiment, the source 162 and the drain 166 may include a negative dopant, such as, for example, antimony, phosphorus, arsenic, or any combination thereof.

The TFET 170 may include one or more of a gate, source, drain, source/drain, or any combination thereof. For example, the TFET 170 may include a source 172, a body 174, a fourth gate (not shown), and a drain 176. The fourth gate may be below the body 174. The source 172 and the drain 176 may comprise any semiconductor material known in the art, including, for example, silicon, germanium, silicon-germanium alloy, silicon carbide, silicon-germanium carbide alloy, and compound (e.g. III-V and II-VI) semiconductor materials. In an embodiment, the source 172 may include a positive dopant, such as, for example, boron, aluminium, gallium, or a combination thereof. In an embodiment, the drain 176 may include a negative dopant, such as, for example, antimony, phosphorus, arsenic, or any combination thereof. The TFET 170 may include a high impedance node. The high impedance node may allow a relatively small amount of current through per unit of applied voltage. In an embodiment, the source 172 may be the high impedance node.

In an embodiment, a voltage may be applied to the FET 160 may feed from the FET 160 to the TFET 170. A voltage ($V_{ss}$) may be applied to the source 162 of the FET 160. A voltage may be fed from the drain 166 of the FET 160 to the source 172 of the TFET 170. The TFET 170 has relatively low drain impedance, while the FET 160 has relatively low gate impedance in this configuration. Employing the TFET 170 in the output and the FET 160 in the input is advantageous when both low input impedance and low output impedance are required, such as in very-low-voltage operation.

A method of forming a hybrid circuit is described below with reference to FIGS. 2-24.

Figure 2:
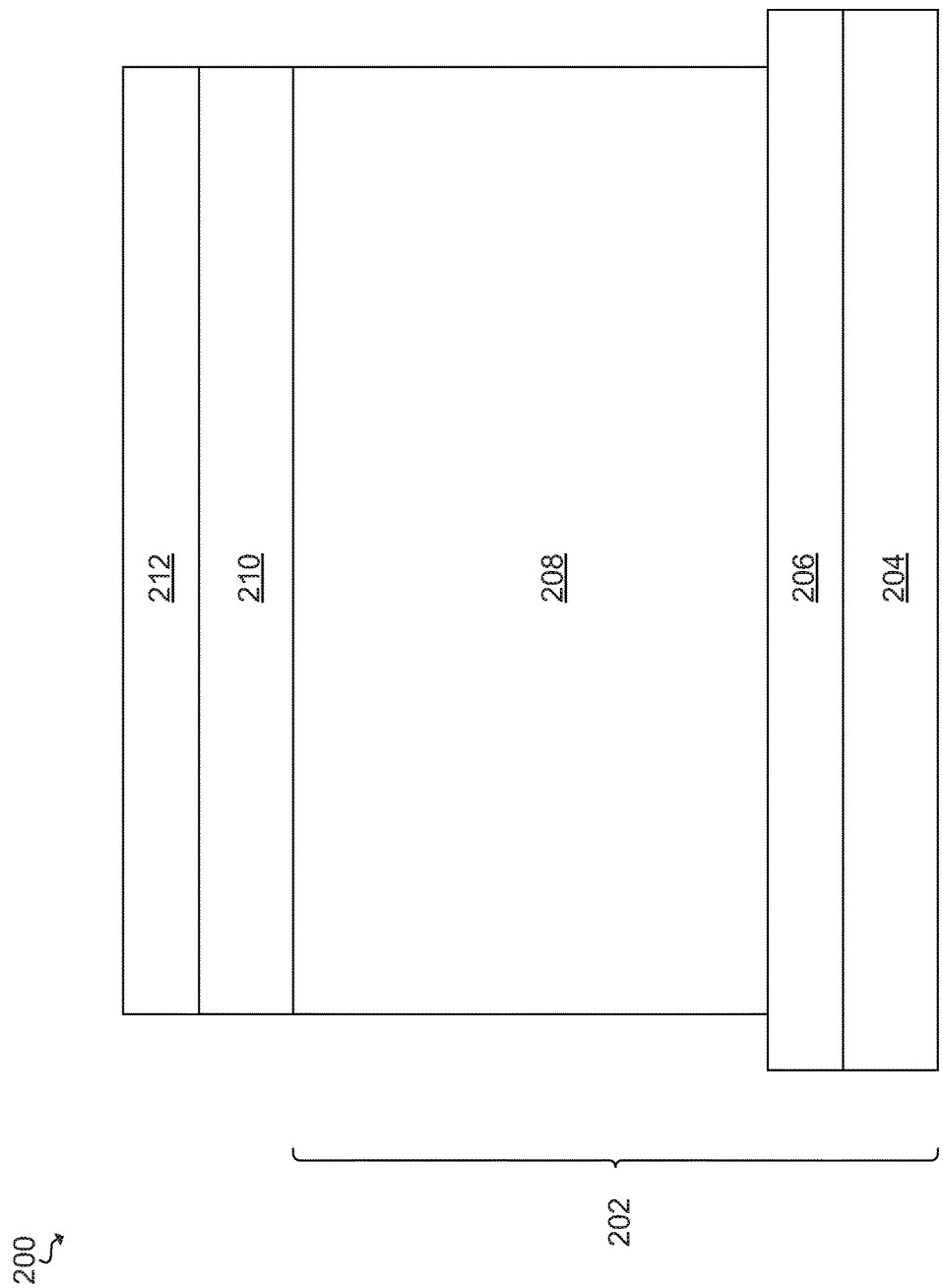
FIG. 2 is a cross section view of a structure, according to an embodiment of the present invention.

Referring now to FIG. 2, a cross section view of a structure 200 is shown, according to an embodiment of the present invention. In an embodiment, the structure 200 may comprise a semiconductor on insulator (SOI) layer 202, a fin cap layer 210, and a first mask layer 212.

The SOI layer 202 may include a substrate 204, a buried insulator layer 206, and a semiconductor layer 208. The substrate 204 may be composed of a semiconductor material, such as, for example, silicon. The buried insulator layer 206 may be composed of a dielectric material, such as, for example, silicon oxide, silicon nitride, silicon oxynitride, SiBCN, SiOCN, or a combination of dielectric materials. The semiconductor layer 208 may be composed of any semiconductor material known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In a preferred embodiment, the semiconductor layer 208 may comprise silicon.

The fin cap layer 210 may be on the SOI layer 202, and the first mask layer 212 may be on the fin cap layer 210. The fin cap layer 210 may be composed of a dielectric material, such as, for example, silicon oxide, silicon nitride, silicon oxynitride, SiBCN, SiOCN, or a combination of dielectric materials. The first mask layer 212 may be composed of any masking material known in the art, such as, for example, photoresist or silicon nitride.

Figure 3:
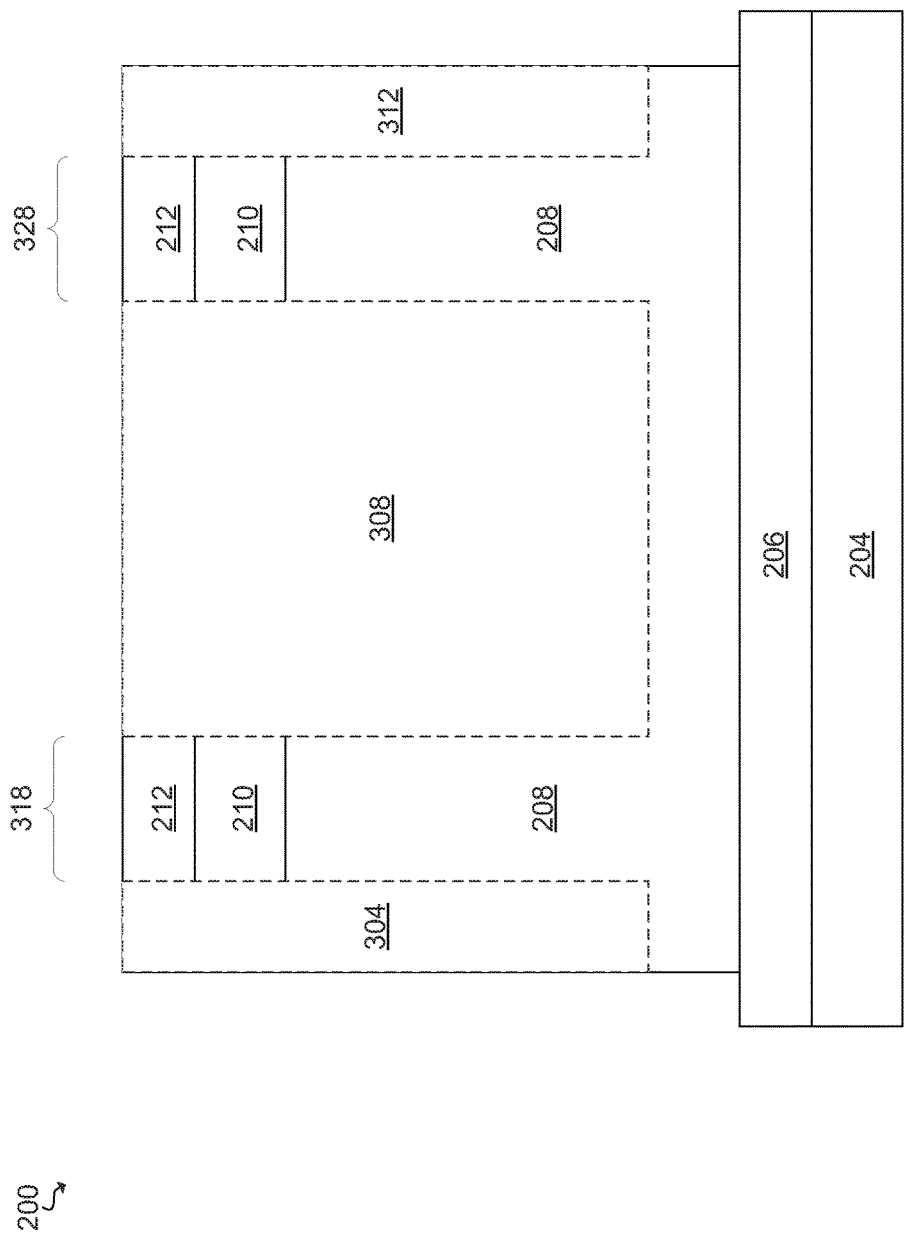
FIG. 3 is a cross section view of removing at least a portion of one or more layers to form a first fin and a second fin, according to an embodiment of the present invention.

Referring now to FIG. 3, a cross section view of removing at least a portion of one or more layers to form a first fin 318 and a second fin 328 is shown, according to an embodiment of the present invention.

The at least a portion of the one or more layers may include a portion 304, a portion 308, and a portion 312. The portion 304 may include a portion of the semiconductor layer 208 (FIG. 2) adjacent to the first fin 318, a portion of the fin cap layer 210 (FIG. 2) adjacent to the first fin 318, and a portion of the first mask layer 212 (FIG. 2) adjacent to the first fin 318. The portion 308 may include a portion of the semiconductor layer 208 (FIG. 2) between the first fin 318 and the second fin 328, a portion of the fin cap layer 210 (FIG. 2) between the first fin 318 and the second fin 328, and a portion of the first mask layer 212 (FIG. 2) between the first fin 318 and the second fin 328. The portion 312 may include a portion of the semiconductor layer 208 (FIG. 2) adjacent to the second fin 328, a portion of the fin cap layer 210 (FIG. 2) adjacent to the second fin 328, and a portion of the first mask layer 212 (FIG. 2) adjacent to the second fin 328. The portion 304, the portion 308, and the portion 312 may be removed by a conventional masking and etching process known in the art, such as, for example, reactive ion etching (RIE).

The first fin 318 and the second fin 328 may be exposed by removing the portion 304, the portion 308, and the portion 312. The first fin 318 may include a first upper portion of the semiconductor layer 208, and the second fin 328 may include a second upper portion of the semiconductor layer 208. A lower portion of the semiconductor layer 208 may remain between the fins (e.g. the first fin 318 and the second fin 328) and the buried insulator layer 206.

Figure 4:
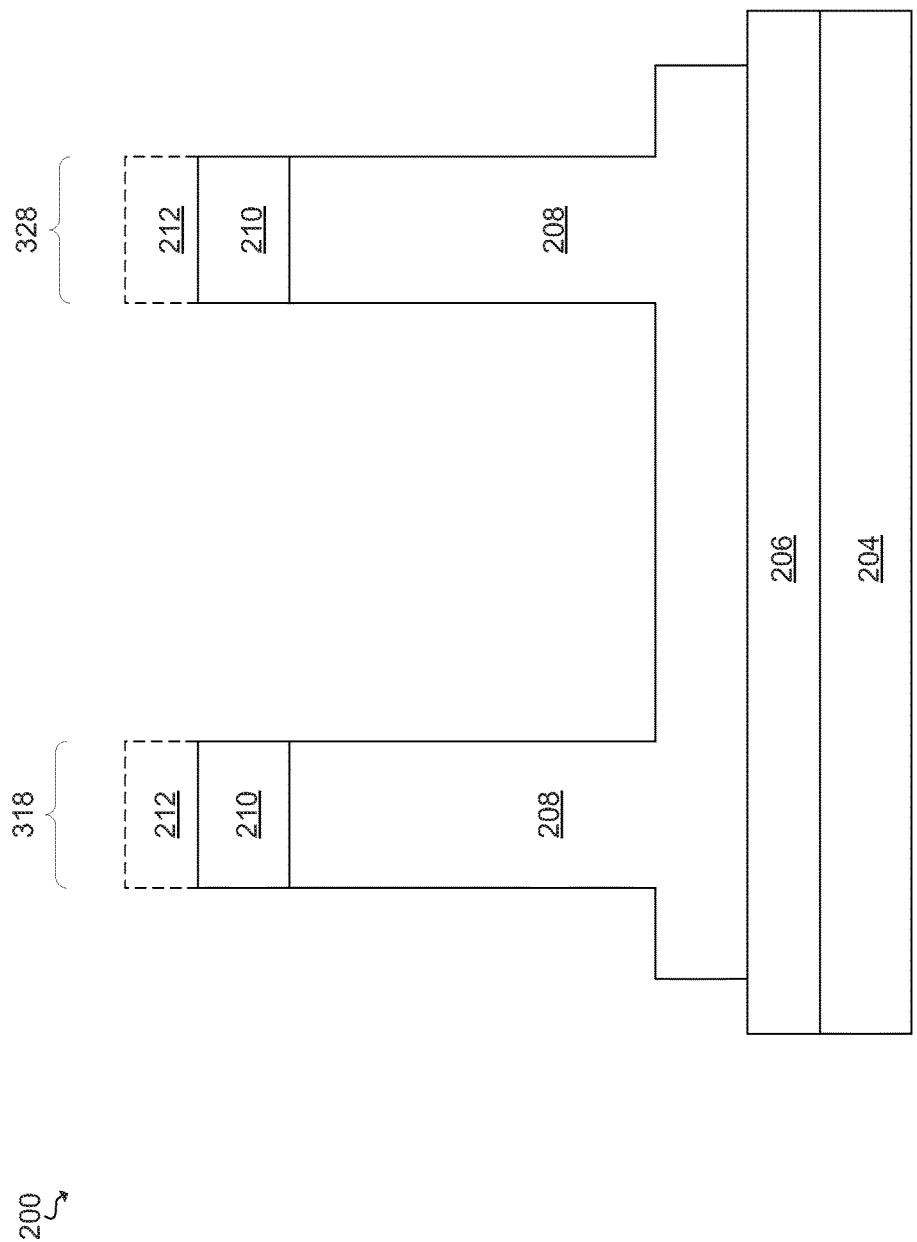
FIG. 4 is a cross section view of removing a first mask layer, according to an embodiment of the present invention.

Referring now to FIG. 4, a cross section view of removing a first mask layer is shown, according to an embodiment of the present invention. The first mask layer 212 may be removed using any removal process known in the art. For example, the first mask layer 212 may be removed using a liquid resist stripper, a plasma, a solvent, or another removal known or contemplated method.

Figure 5:
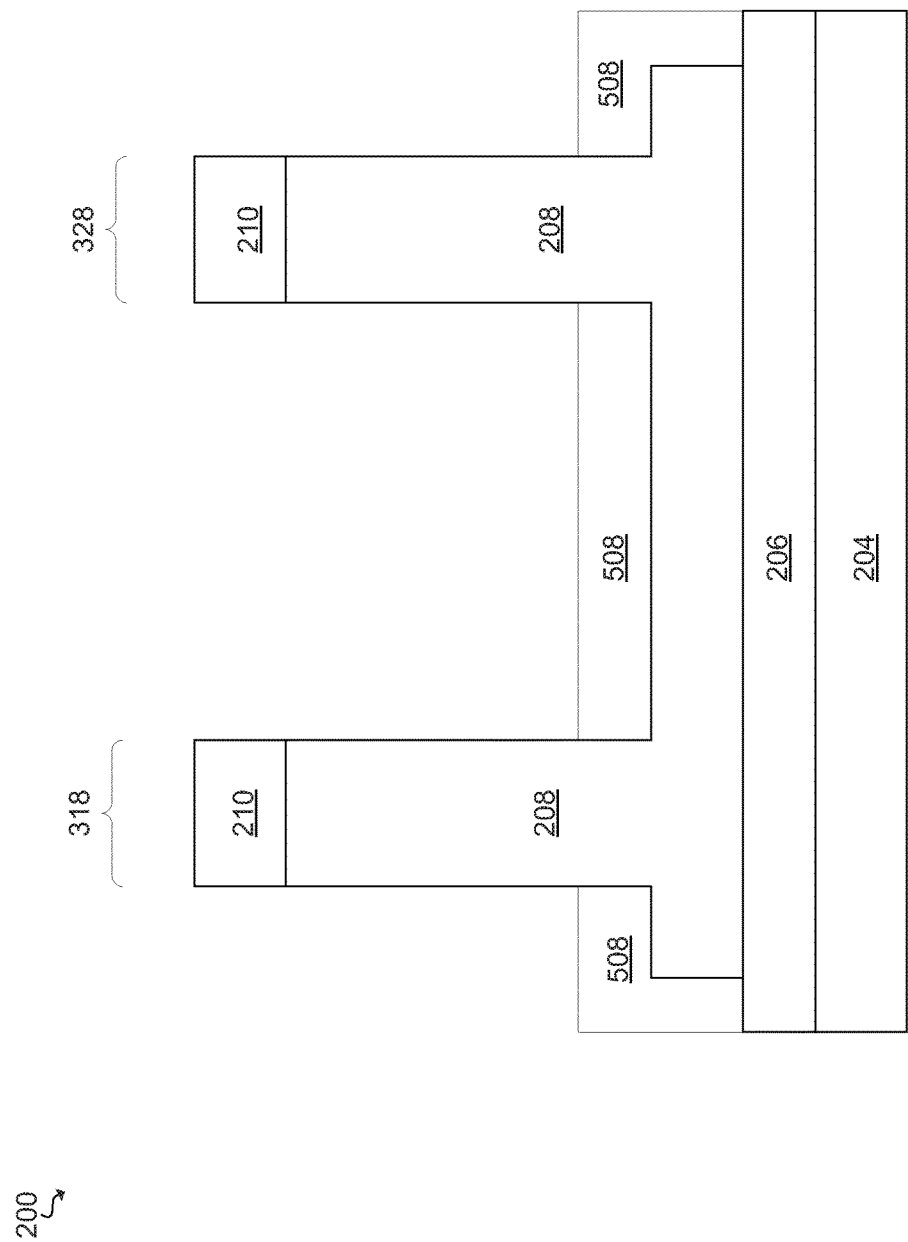
FIG. 5 is a cross section view of forming a first dielectric layer on an upper surface of a lower portion of a semiconductor layer, according to an embodiment of the present invention.

Referring now to FIG. 5, a cross section view of forming a first dielectric layer 508 on an upper surface of a lower portion of the semiconductor layer 208 is shown, according to an embodiment of the present invention. The first dielectric layer 508 may be composed of a dielectric material, such as, for example, silicon oxide, silicon nitride, silicon oxynitride, SiBCN, SiOCN, or a combination of dielectric materials. The first dielectric layer 508 may be formed using a conventional deposition technique, such as, for example, chemical vapor deposition (CVD), physical vapor deposition (PVD), plasma enhanced CVD (PECVD), molecular beam deposition (MBD), pulsed laser deposition (PLD), atomic layer deposition (ALD), liquid source misted chemical deposition (LSMCD), or spin on deposition.

Figure 6:
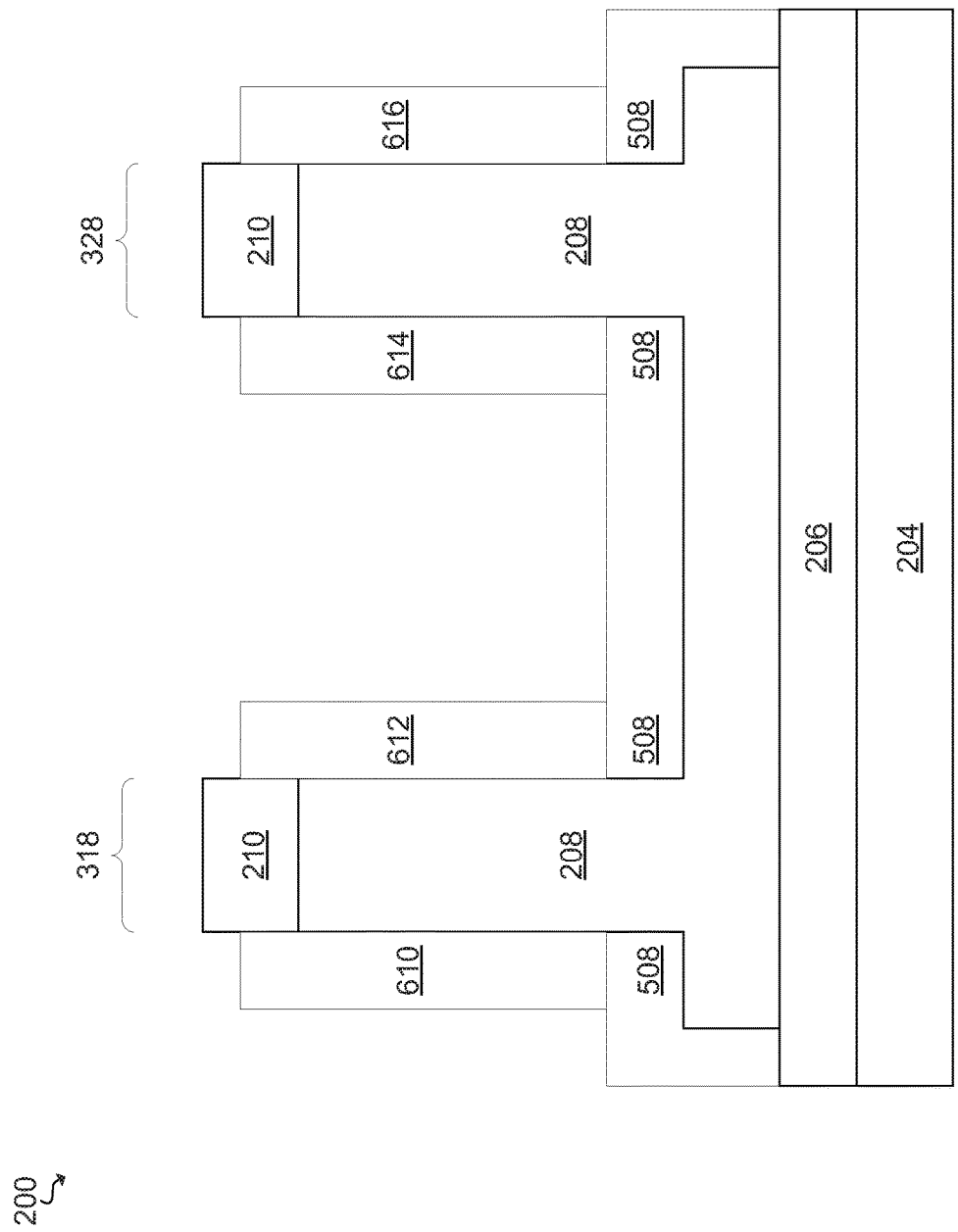
FIG. 6 is a cross section view of forming a spacer adjacent to a sidewall of the first fin and a sidewall of the second fin, according to an embodiment of the present invention.

Referring now to FIG. 6, a cross section view of forming a first spacer 610 and a second spacer 612 adjacent to a sidewall of the first fin 318 and a third spacer 614 and a fourth spacer 616 adjacent to a sidewall of the second fin 328 is shown, according to an embodiment of the present invention. The first spacer 610 may be adjacent to and contacting a first sidewall of the first fin 318, and the second spacer 612 may be adjacent to and contacting a second sidewall of the first fin 318. The third spacer 614 may be adjacent to and contacting a first sidewall of the second fin 328, and the fourth spacer 616 may be adjacent to and contacting a second sidewall of the second fin 328. The first spacer 610, the second spacer 612, the third spacer 614, and the fourth spacer 616 may be composed of a dielectric material, such as, for example, silicon oxide, silicon nitride, silicon oxynitride, SiBCN, SiOCN, or a combination of dielectric materials. The first spacer 610, the second spacer 612, the third spacer 614, and the fourth spacer 616 may be formed using a conventional deposition technique, such as, for example, CVD, PVD, PECVD, MBD, PLD, ALD, or LSMCD.

Figure 7:
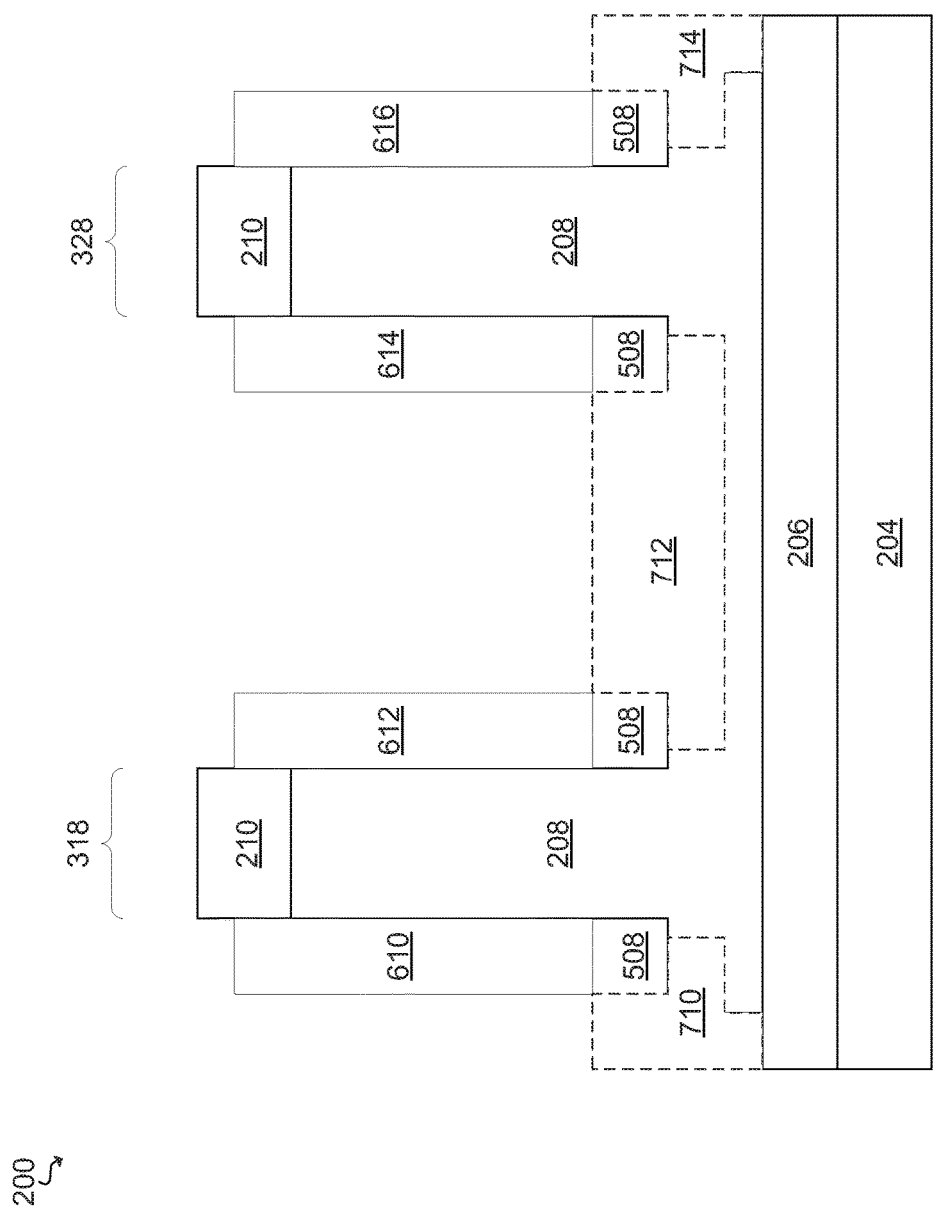
FIG. 7 is a cross section view of removing a portion of the first dielectric layer and removing a portion of the lower portion of the semiconductor layer, according to an embodiment of the present invention.

Referring now to FIG. 7, a cross section view of removing a portion of the first dielectric layer 508 and removing a portion of the lower portion of the semiconductor layer 208 is shown, according to an embodiment of the present invention. The portion of the lower portion of the semiconductor layer 208 may include a portion 710, a portion 712, and a portion 714. The portion of the first dielectric layer 508 and the portion of the lower portion of the semiconductor layer 208 may be removed using a conventional etching process, such as, for example, a buffered oxide etch, aqueous hydrofluoric acid (HF) etch, or RIE.

Figure 8:
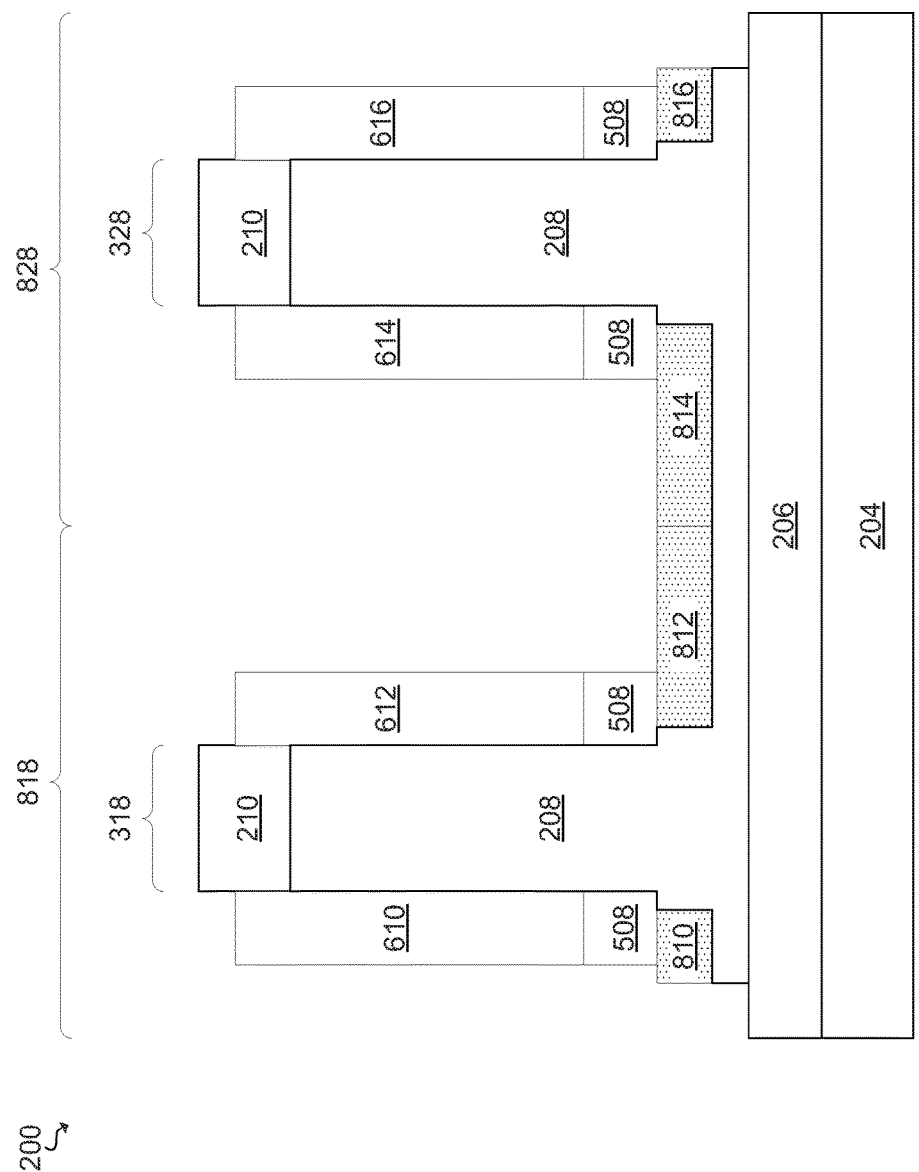
FIG. 8 is a cross section view of forming a first doped layer and a second doped layer on an upper surface of the lower portion of the semiconductor layer, according to an embodiment of the present invention.

Referring now to FIG. 8, a cross section view of forming a first doped layer 810 and a second doped layer 812 in a first active area 818 and a third doped layer 814 and a fourth doped layer 816 in a second active area 828 is shown, according to an embodiment of the present invention. The first doped layer 810, the second doped layer 812, the third doped layer 814, and the fourth doped layer 816 may be formed on an upper surface of the lower portion of the semiconductor layer 208. The first doped layer 810, the second doped layer 812, the third doped layer 814, and the fourth doped layer 816 may be composed of any semiconductor material known in the art, including, for example, silicon, germanium, silicon-germanium alloy, silicon carbide, silicon-germanium carbide alloy, and compound (e.g. III-V and II-VI) semiconductor materials. The first doped layer 810, the second doped layer 812, the third doped layer 814, and the fourth doped layer 816 may include any dopant known in the art, such as, for example, nitrogen, phosphorus, arsenic, antimony, boron, aluminum, gallium, indium, or any combination of dopants. In an embodiment, the first doped layer 810, the second doped layer 812, the third doped layer 814, and the fourth doped layer 816 may be n-doped silicon. In another embodiment, the first doped layer 810 and the second doped layer 812 may be n-doped silicon and the third doped layer 814 and the fourth doped layer 816 may be p-doped silicon. The first doped layer 810, the second doped layer 812, the third doped layer 814, and the fourth doped layer 816 may be formed using a conventional epitaxial deposition process known in the art, such as, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), or molecular beam epitaxy (MBE).

Figure 9:
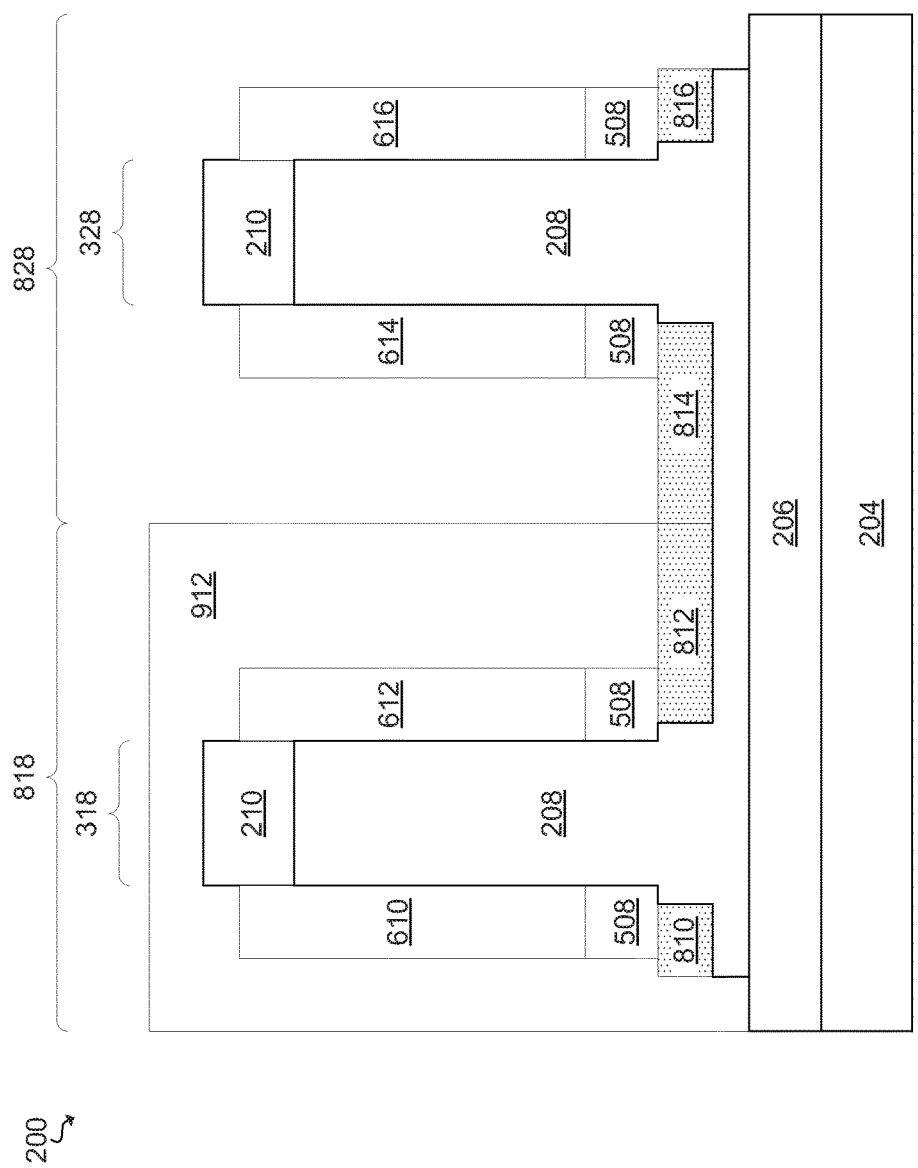
FIG. 9 is a cross section view of forming a second mask layer on a first active area, according to an embodiment of the present invention.

Referring now to FIG. 9, a cross section view of forming a second mask layer 912 on a first active area 818 is shown, according to an embodiment of the present invention. The second mask layer 912 may be composed of any masking material known in the art, such as, for example, silicon nitride or photoresist. The second mask layer 912 may be formed using a conventional deposition technique, such as, for example, CVD, PVD, PECVD, MBD, PLD, ALD, LSMCD, or spin on deposition.

Figure 10:
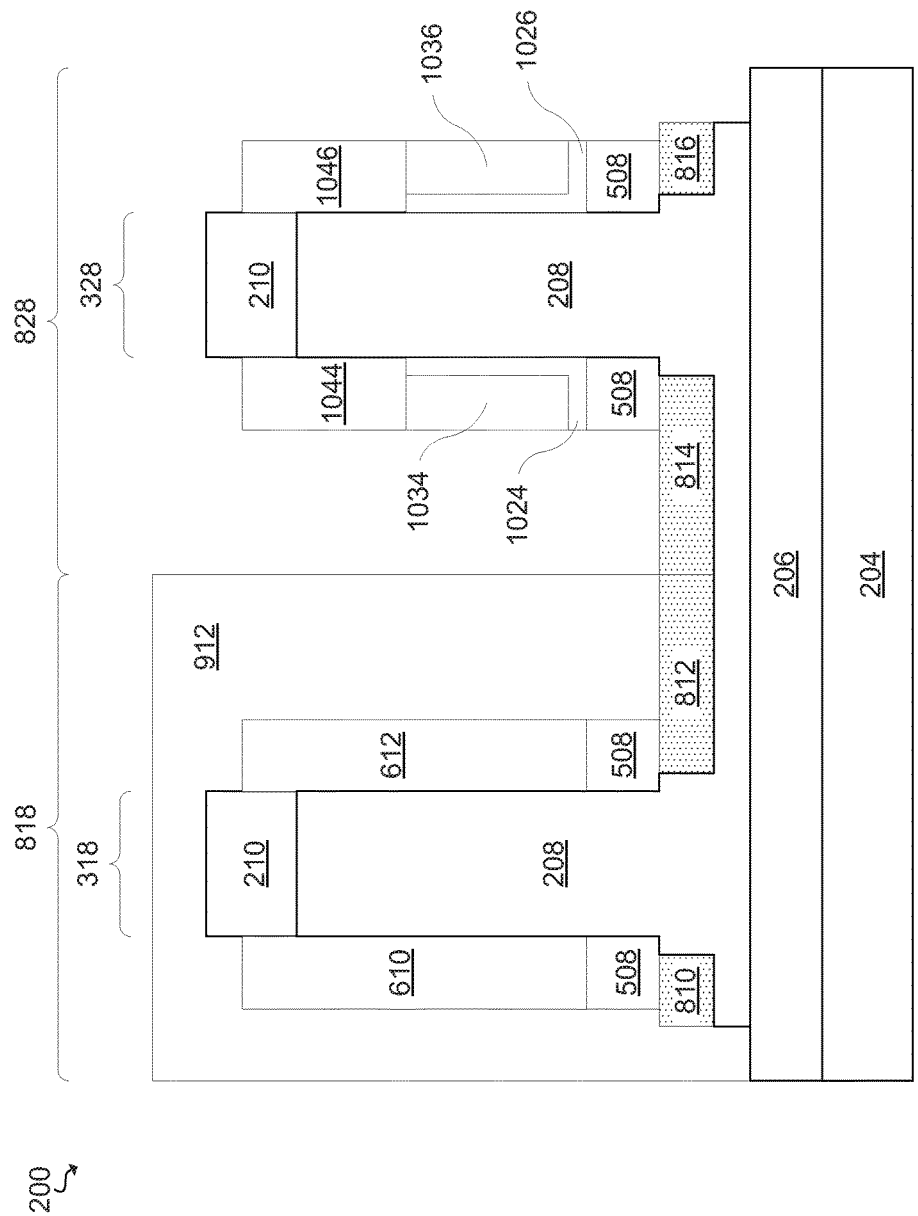
FIG. 10 is a cross section view of forming a tunnel gate stack on the second fin, according to an embodiment of the present invention.

Referring now to FIG. 10, a cross section view of forming a tunnel gate stack on the second fin 328 is shown, according to an embodiment of the present invention. In an embodiment, the third spacer 614 (FIG. 8) and the fourth spacer 616

(FIG. 8) may be removed using a conventional etching process known in the art, such as, for example, reactive ion etching (RIE). The tunnel gate stack may include a gate dielectric 1024, a gate dielectric 1026, a gate electrode 1034, a gate electrode 1036, a spacer 1044, and a spacer 1046. Excess material may be removed (using a conventional removal method, such as, for example, RIE) to leave the tunnel gate stack only on sidewalls of the second fin 328.

The gate dielectric 1024 and the gate dielectric 1026 may be composed of a high dielectric constant (high-k dielectric) material, such as, for example, hafnium silicate or a combination of dielectric materials. The gate dielectric 1024 and the gate dielectric 1026 may be formed using a conventional deposition technique, such as, for example, CVD, PVD, PECVD, MBD, PLD, ALD, LSMCD, or spin on deposition.

The gate electrode 1034 and the gate electrode 1036 may be composed of a conductive material, such as, for example, titanium nitride, tungsten, or a combination of conductive materials. The gate electrode 1034 and the gate electrode 1036 may be formed using a conventional deposition technique, such as, for example, CVD, PVD, PECVD, MBD, PLD, ALD, LSMCD, or spin on deposition.

The spacer 1044 and the spacer 1046 may be composed of a dielectric material, such as, for example, silicon oxide, silicon nitride, silicon oxynitride, SiBCN, SiOCN, or a combination of dielectric materials. The spacer 1044 and the spacer 1046 may be formed using a conventional deposition technique, such as, for example, CVD, PVD, PECVD, MBD, PLD, ALD, LSMCD, or spin on deposition.

Figure 11:
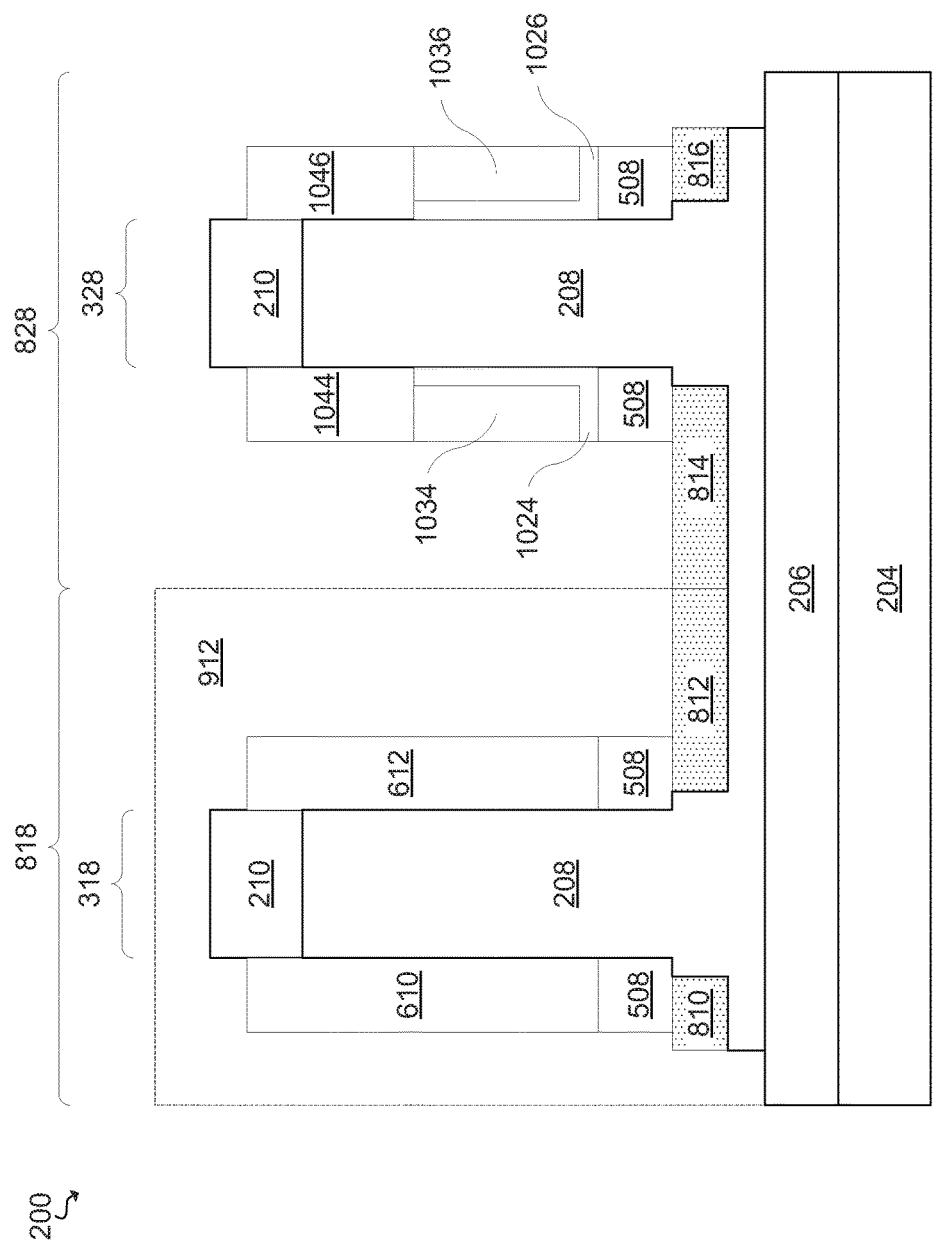
FIG. 11 is a cross section view of removing the second mask layer, according to an embodiment of the present invention.

Referring now to FIG. 11, a cross section view of removing the second mask layer 912 is shown, according to an embodiment of the present invention. The second mask layer 912 may be removed using a conventional etching method, such as, for example, a wet etch or a plasma etch.

Figure 12:
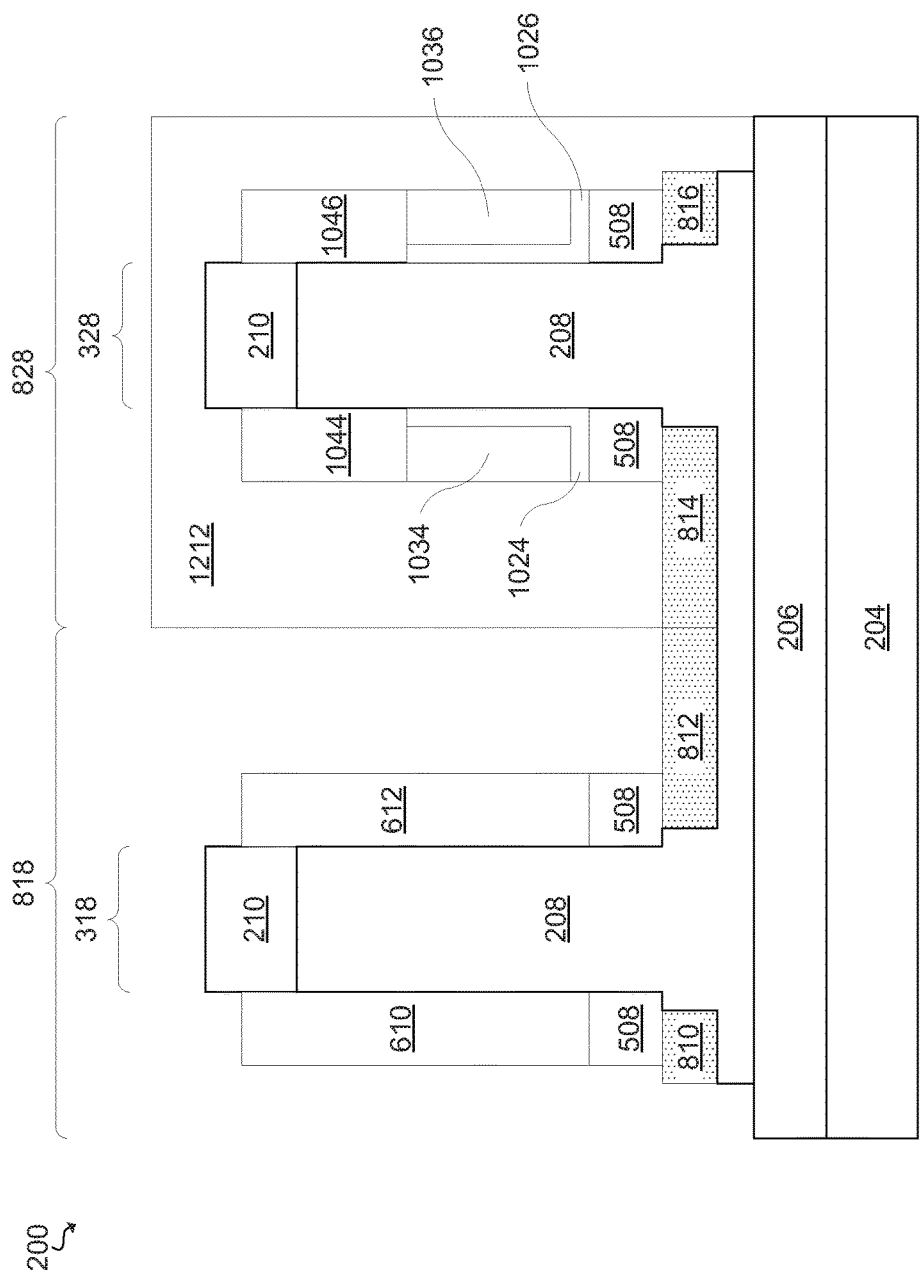
FIG. 12 is a cross section view of forming a third mask layer on the second active area, according to an embodiment of the present invention.

Referring now to FIG. 12, a cross section view of forming a third mask layer 1212 on the second active area 828 is shown, according to an embodiment of the present invention. The third mask layer 1212 may be composed of any masking material known in the art, such as, for example, silicon nitride or photoresist. The third mask layer 1212 may be formed using a conventional deposition technique, such as, for example, CVD, PVD, PECVD, MBD, PLD, ALD, LSMCD, or spin on deposition.

Figure 13:
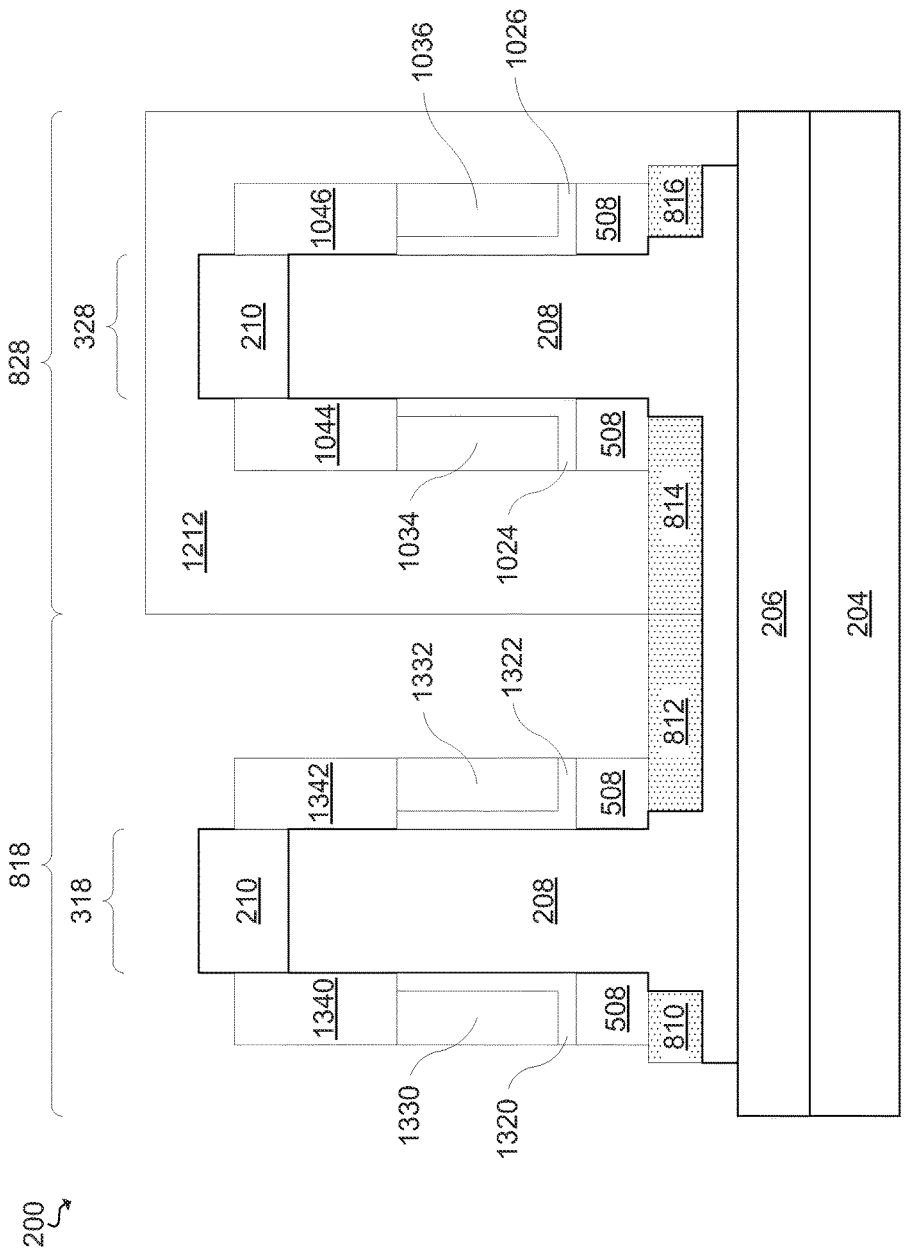
FIG. 13 is a cross section view of forming a conventional gate stack on the first fin, according to an embodiment of the present invention.

Referring now to FIG. 13, a cross section view of forming a conventional gate stack on the first fin 918 is shown, according to an embodiment of the present invention. In an embodiment, the first spacer 610 (FIG. 12) and the second spacer 612 (FIG. 12) may be removed using a conventional etching process known in the art, such as, for example, RIE. The tunnel gate stack may include a gate dielectric 1320, a gate dielectric 1322, a gate electrode 1330, a gate electrode 1332, a spacer 1340, and a spacer 1342. Excess material may be removed (using a conventional removal method, such as, for example, RIE) to leave the tunnel gate stack only on sidewalls of the first fin 318.

The gate dielectric 1320 and the gate dielectric 1322 may be composed of a high dielectric constant (high-k dielectric) material, such as, for example, hafnium silicate or a combination of dielectric materials. The gate dielectric 1320 and the gate dielectric 1322 may be formed using a conventional deposition technique, such as, for example, CVD, PVD, PECVD, MBD, PLD, ALD, LSMCD, or spin on deposition.

The gate electrode 1330 and the gate electrode 1332 may be composed of a conductive material, such as, for example, titanium nitride, tungsten, or a combination of conductive materials. The gate electrode 1330 and the gate electrode 1332 may be formed using a conventional deposition technique, such as, for example, CVD, PVD, PECVD, MBD, PLD, ALD, LSMCD, or spin on deposition.

The spacer 1340 and the spacer 1342 be composed of a dielectric material, such as, for example, silicon oxide, silicon nitride, silicon oxynitride, SiBCN, SiOCN, or a combination of dielectric materials. The spacer 1340 and the spacer 1342 may be formed using a conventional deposition technique, such as, for example, CVD, PVD, PECVD, MBD, PLD, ALD, LSMCD, or spin on deposition.

The conventional gate stack and the tunnel gate stack may modulate channel conductivity. The conventional gate stack may modulate conductivity of the first fin 318. The tunnel gate stack may modulate conductivity of the second fin 328.

Figure 14:
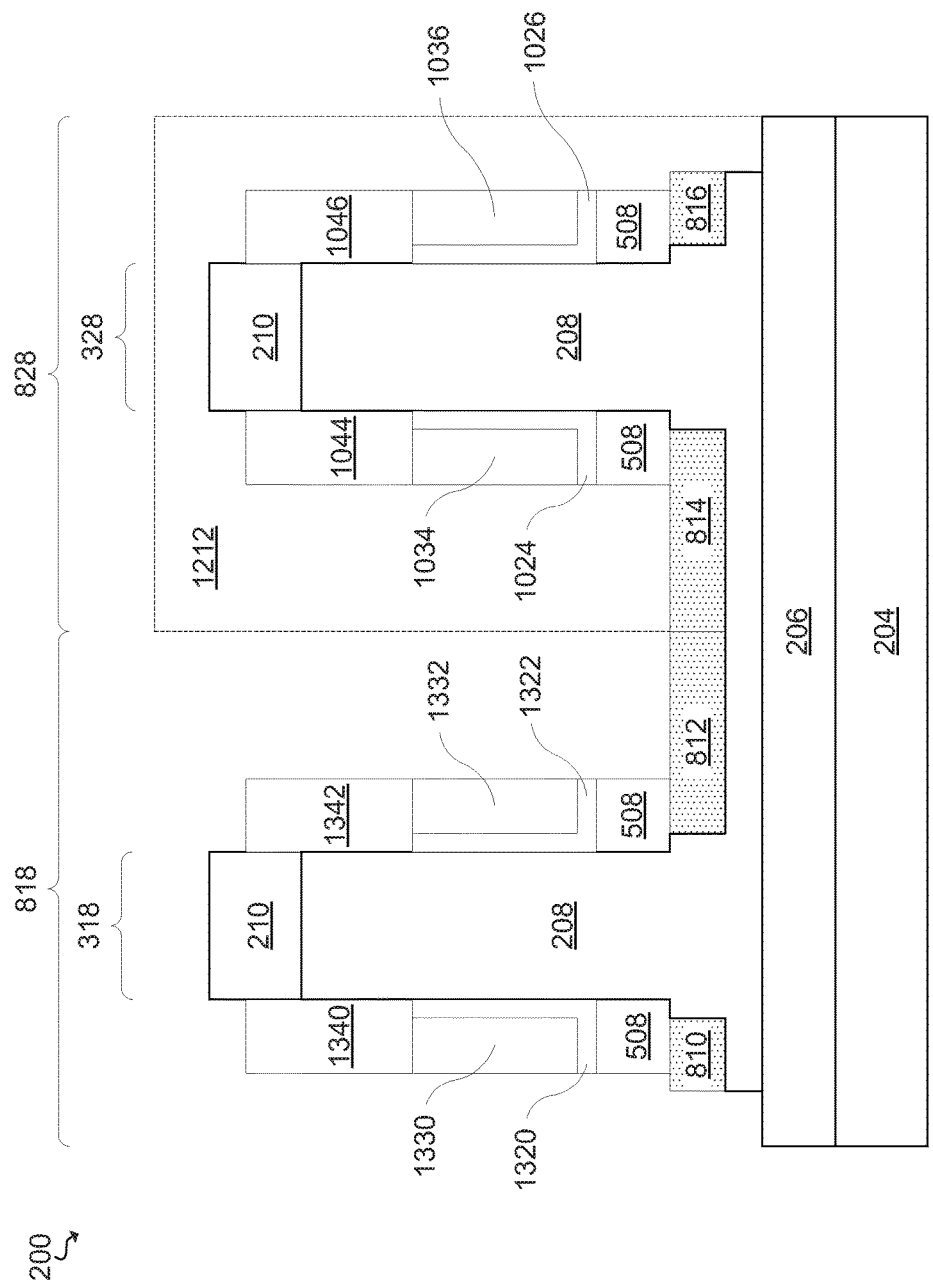
FIG. 14 is a cross section view of removing the third mask layer, according to an embodiment of the present invention.

Referring now to FIG. 14, a cross section view of removing the third mask layer 1212 is shown, according to an embodiment of the present invention. The second mask layer 912 may be removed using a conventional etching method, such as, for example, a wet etch or a plasma etch.

Figure 15:
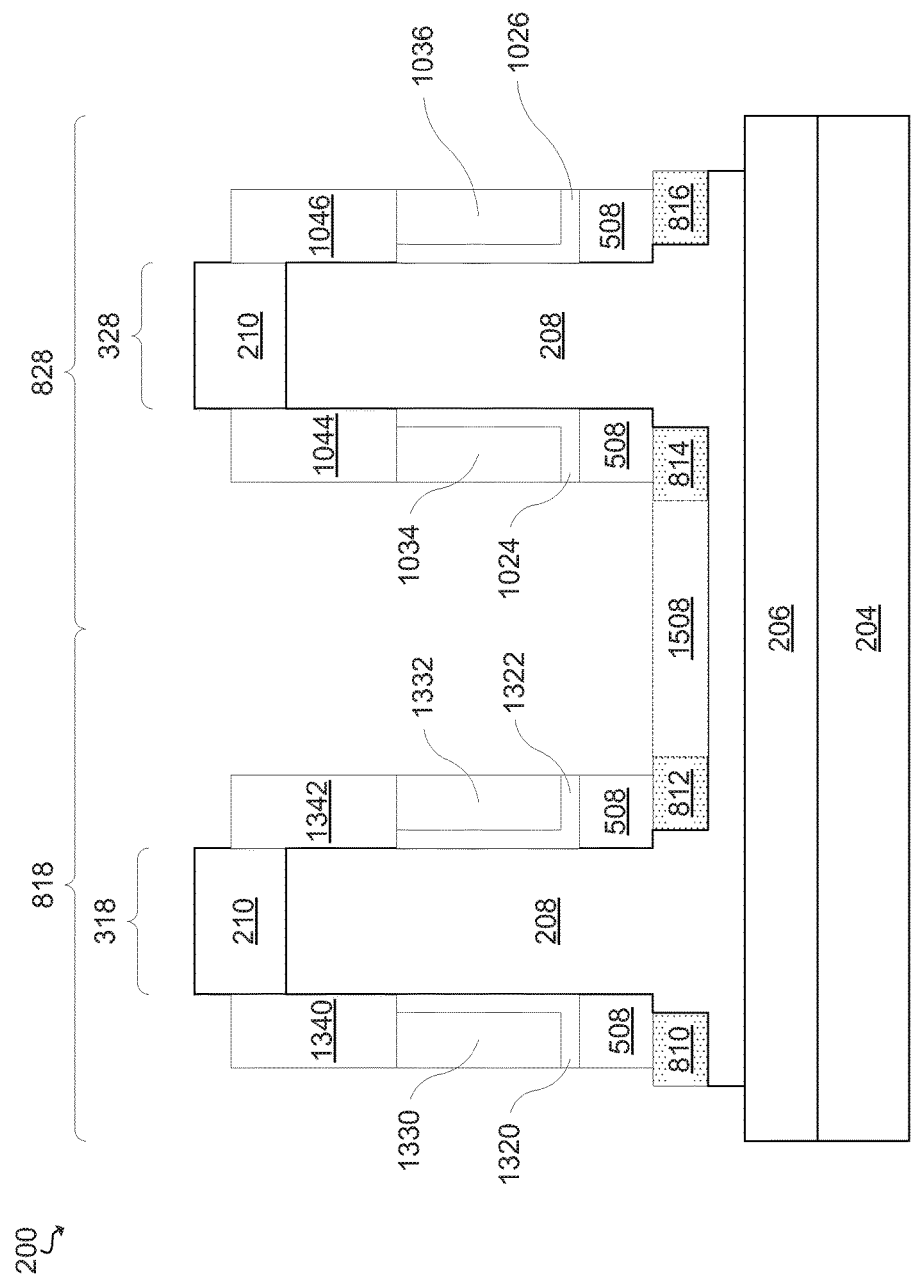
FIG. 15 is a cross section view of removing a portion of the first doped layer and a portion of the second doped, according to an embodiment of the present invention.

Referring now to FIG. 15, a cross section view of removing a portion of the second doped layer 812 and a portion of the third doped layer 814 (collectively hereinafter "middle region 1508") is shown, according to an embodiment of the present invention. The middle region 1508 may include the portion of the second doped layer 812 (FIG. 14) adjacent to the portion of the third doped layer 814 (FIG. 14). The middle region 1508 may be located between the first fin 318 and the second fin 328. The portion of the second doped layer 812 and the portion of the third doped layer 814 may be removed using a conventional etching method, such as, for example, a wet etch or a plasma etch.

Figure 16:
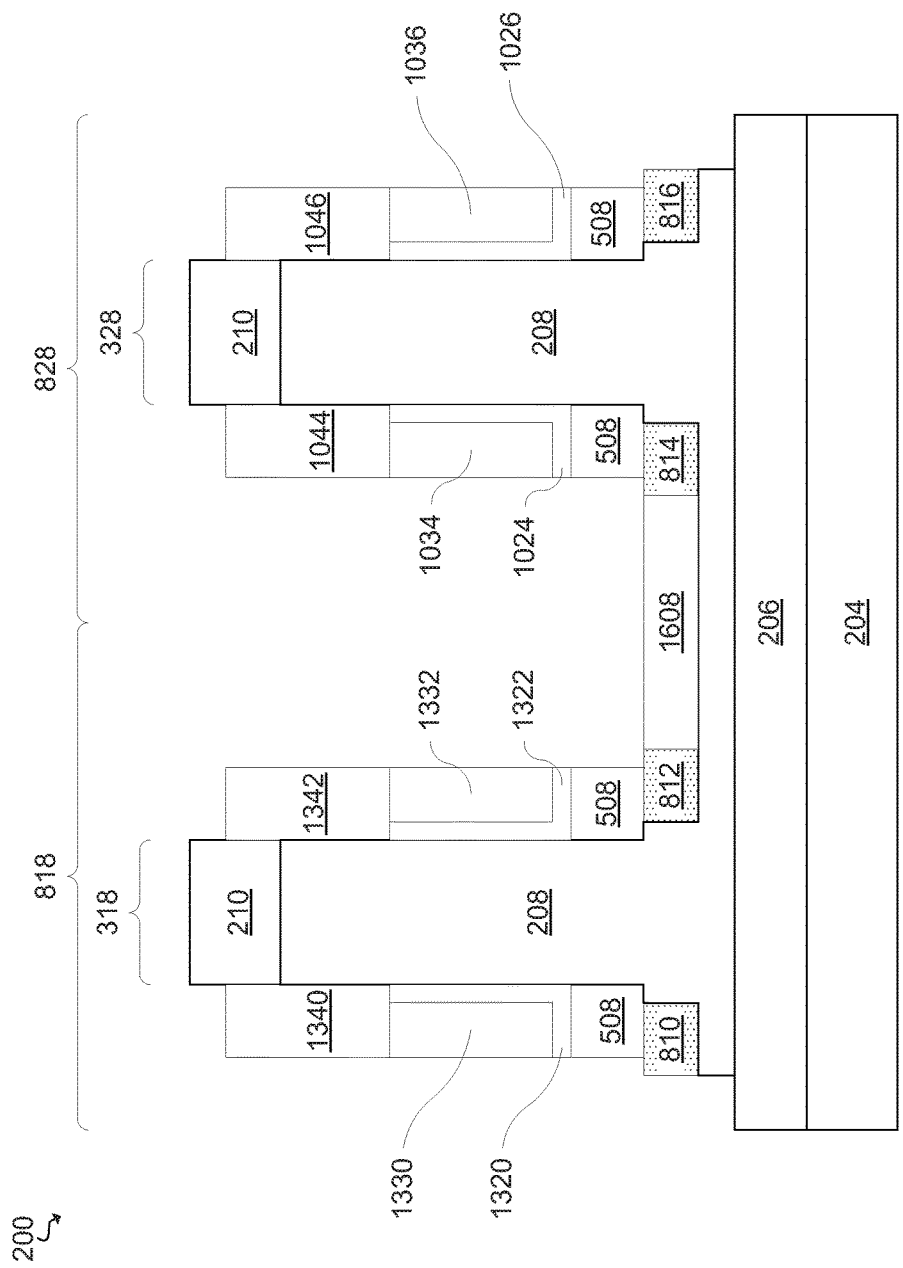
FIG. 16 is a cross section view of forming a first conductive layer, according to an embodiment of the present invention.

Referring now to FIG. 16, a cross section view of forming a first conductive layer 1608 adjacent to and in contact with the second doped layer 812 and the third doped layer 814 is shown, according to an embodiment of the present invention. The first conductive layer 1608 may be composed of any conductive material, such as, for example, tungsten. The first conductive layer 1608 may be formed in the middle region 1508 (FIG. 15). A sidewall of the first conductive layer 1608 may be adjacent to and in contact with a sidewall of the second doped layer 812. A sidewall of the first conductive layer 1608 may be adjacent to and in contact with a sidewall of the third doped layer 814. The first conductive layer 1608 may operate as a conductor between the second doped layer 812 and the third doped layer 814. The first conductive layer 1608 may be formed over a lower portion of the semiconductor layer 208. The first conductive layer 1608 may be formed using any conventional deposition technique, such as, for example, CVD, PVD, PECVD, MBD, PLD, ALD, LSMCD, or spin on deposition.

Figure 17:
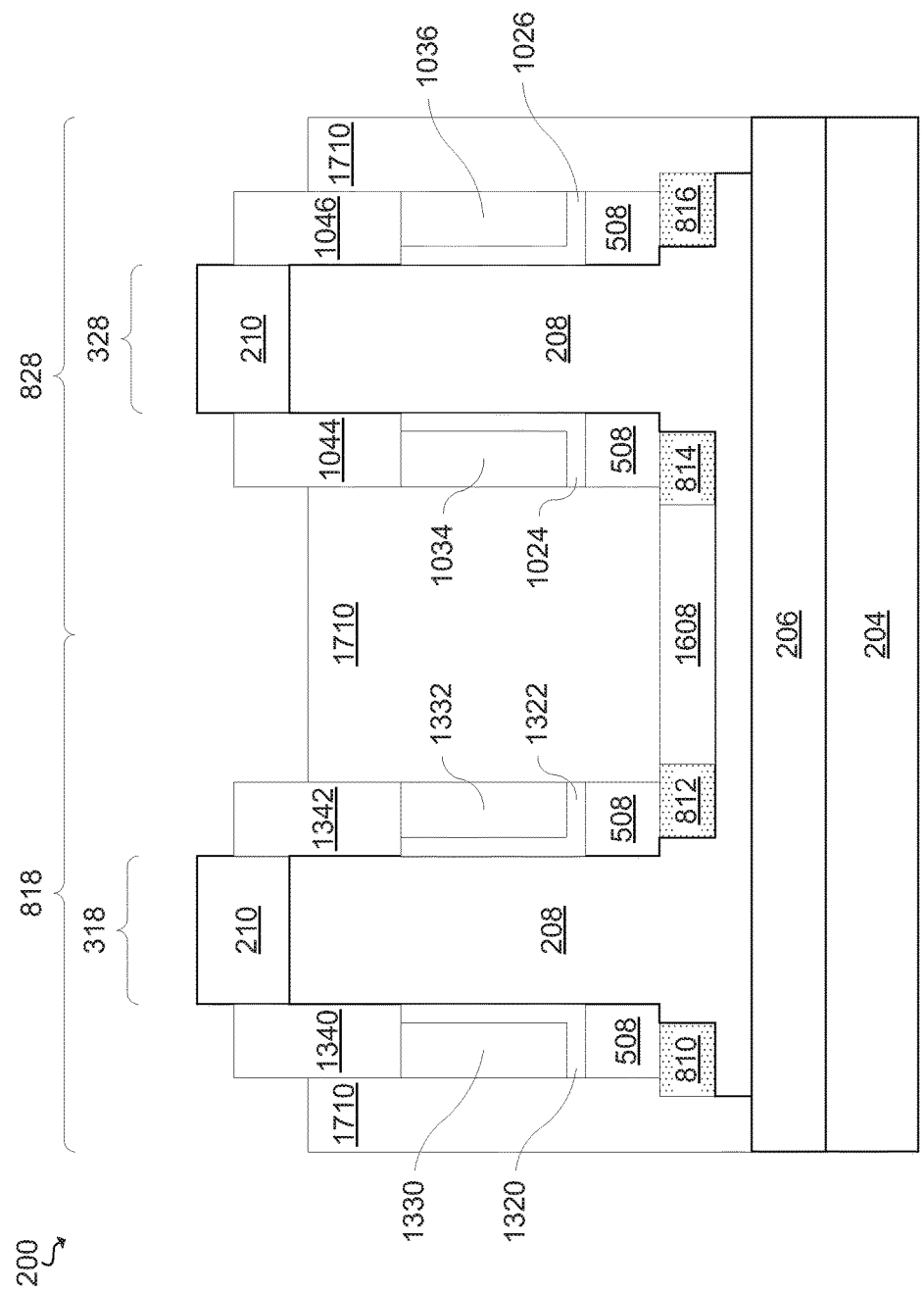
FIG. 17 is a cross section view of forming a second dielectric layer, according to an embodiment of the present invention.

Referring now to FIG. 17, a cross section view of forming a second dielectric layer 1710 is shown, according to an embodiment of the present invention. The second dielectric layer 1710 may be formed adjacent to each side of the conventional gate and adjacent to each side of the tunnel gate. The second dielectric layer 1710 may be formed over the first conductive layer 1608. The second dielectric layer 1710 may be composed of a dielectric material, such as, for example, silicon oxide, silicon nitride, silicon oxynitride, SiBCN, SiOCN, or a combination of dielectric materials. The second dielectric layer 1710 may be formed using a conventional deposition technique, such as, for example, CVD, PVD, PECVD, MBD, PLD, ALD, LSMCD, or spin on deposition. In an embodiment, an excess portion (not shown) of the second dielectric layer 1710 may be removed by a conventional planarization method, such as, for example, chemical mechanical planarization (CMP).

Figure 18:
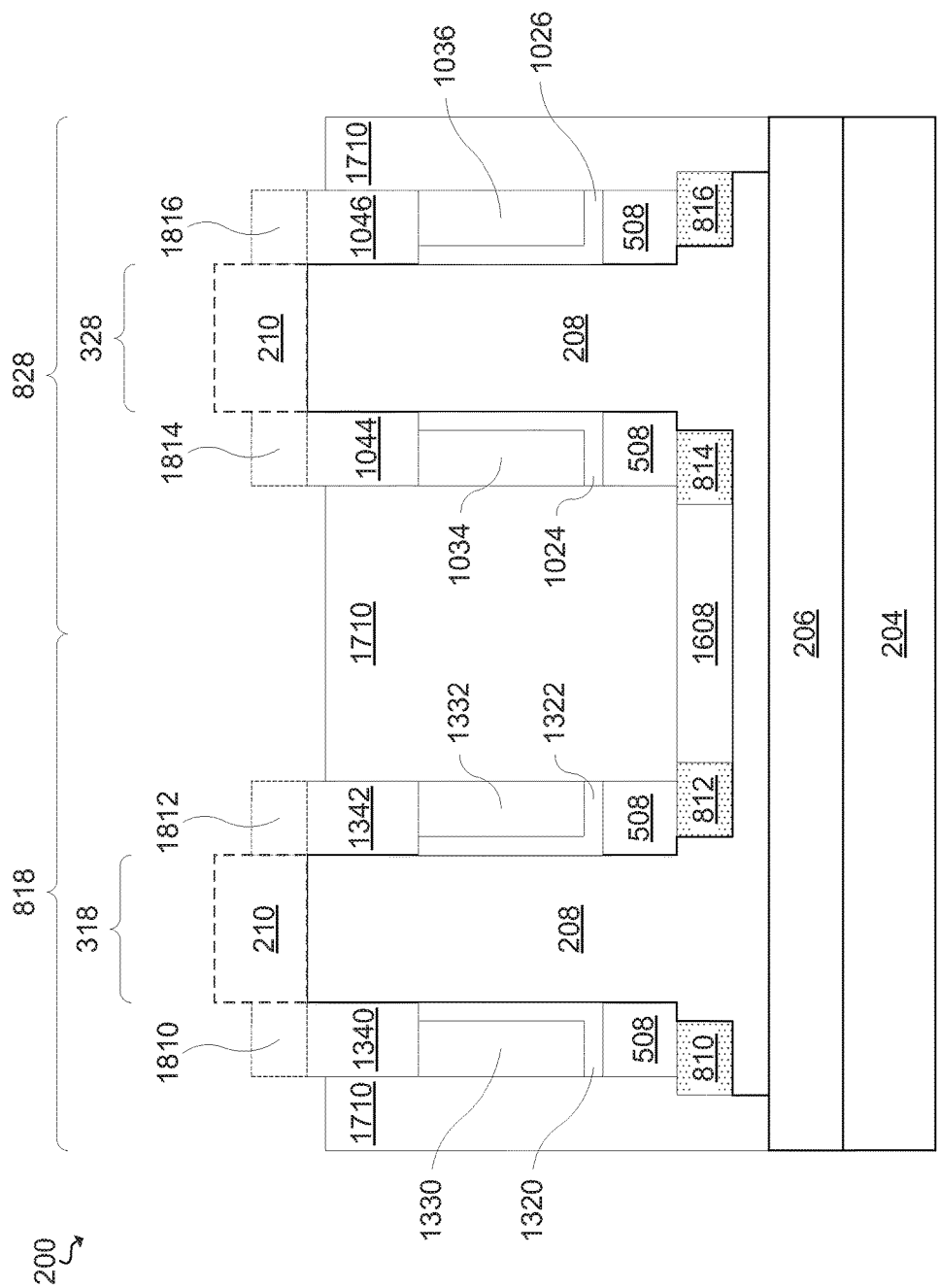
FIG. 18 is a cross section view of removing a fin cap layer and removing an upper portion of one or more spacers, according to an embodiment of the present invention.

Referring now to FIG. 18, a cross section view of removing the fin cap layer 210 and removing an upper portion 1810 of the spacer 1340, an upper portion 1812 of the spacer 1342, an upper portion 1814 of the spacer 1044, and an upper portion 1816 of the spacer 1046 is shown, according to an embodiment of the present invention. Removing the fin cap layer 210 may expose an upper portion of the first fin 318 and an upper portion of the second fin 328. The fin cap layer 210, the upper portion 1810 of the spacer 1340, the upper portion 1812 of the spacer 1342, the upper portion 1814 of the spacer 1044, and the upper portion 1816 of the spacer 1046 may be removed using any conventional etching method, such as, for example, RIE.

Figure 19:
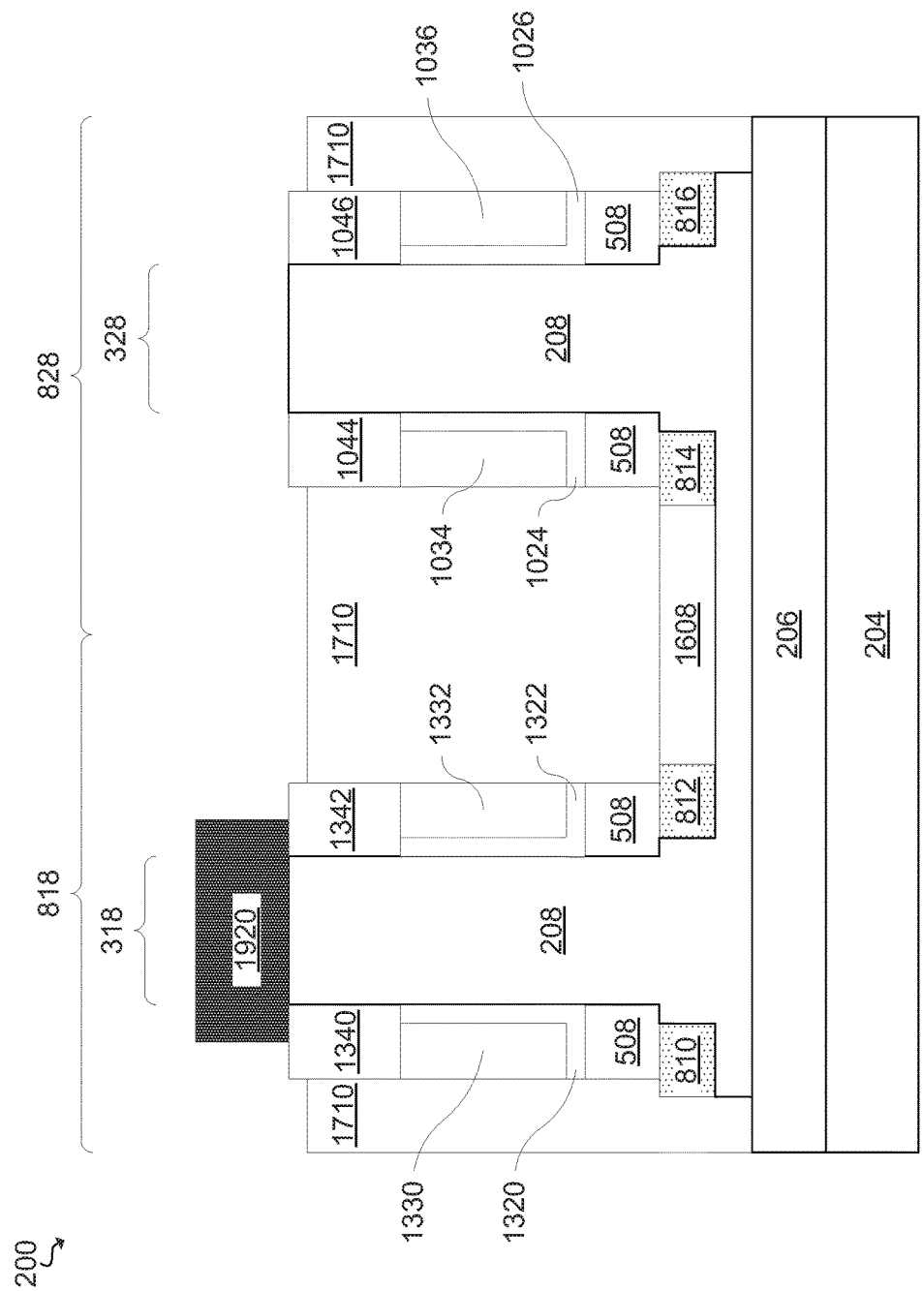
FIG. 19 is a cross section view of forming a third doped layer, according to an embodiment of the present invention.

Referring now to FIG. 19, a cross section view of forming a fifth doped layer 1920 is shown, according to an embodiment of the present invention. The fifth doped layer 1920 may be composed of any semiconductor material known in the art, including, for example, silicon, germanium, silicon-germanium alloy, silicon carbide, silicon-germanium carbide alloy, and compound (e.g. III-V and II-VI) semiconductor materials. In an embodiment, the fifth doped layer 1920 may include a positive dopant, such as, for example, boron, aluminium, gallium, or a combination thereof. In an embodiment, the fifth doped layer 1920 may include a negative dopant, such as, for example, antimony, phosphorus, arsenic, or any combination thereof. In a preferred embodiment, the fifth doped layer 1920 may include a different dopant that the third doped layer 814 and the fourth doped layer 816. For example, if the third doped layer 814 and the fourth doped layer 816 include an n-type dopant, the fifth doped layer 1920 may include a p-type dopant. The fifth doped layer 1920 may be formed using a conventional epitaxial deposition process known in the art, such as, for example, RTCVD, LEPD, UHVCVD, APCVD, or MBE.

Figure 20:
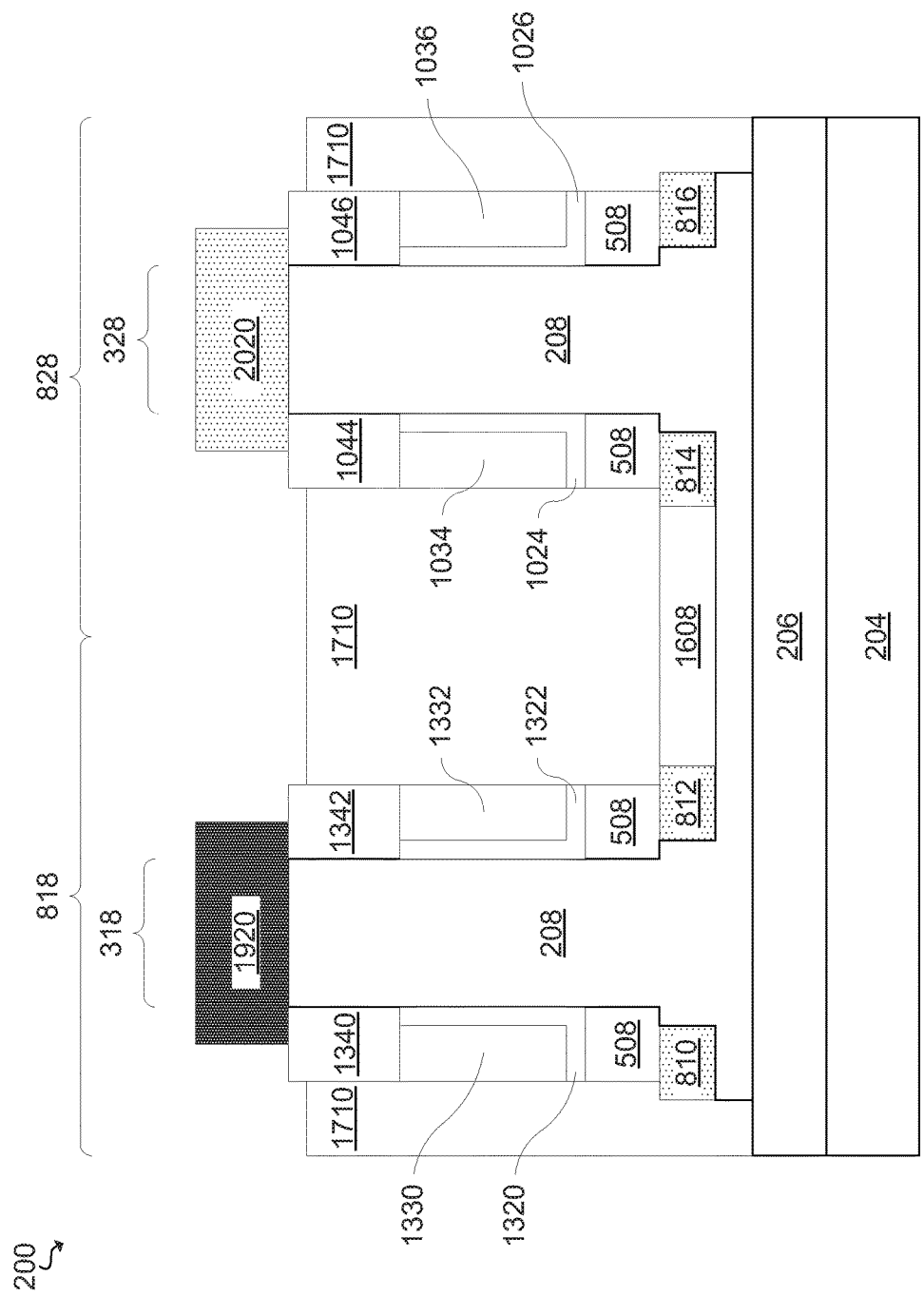
FIG. 20 is a cross section view of forming a fourth doped layer, according to an embodiment of the present invention.

Referring now to FIG. 20, a cross section view of forming a sixth doped layer 2020 is shown, according to an embodiment of the present invention. The sixth doped layer 2020 may be composed of any semiconductor material known in the art, including, for example, silicon, germanium, silicon-germanium alloy, silicon carbide, silicon-germanium carbide alloy, and compound (e.g. III-V and II-VI) semiconductor materials. In an embodiment, the sixth doped layer 2020 may include a positive dopant, such as, for example, boron, aluminium, gallium, or a combination thereof. In an embodiment, the sixth doped layer 2020 may include a negative dopant, such as, for example, antimony, phosphorus, arsenic, or any combination thereof. The sixth doped layer 2020 may be formed using a conventional epitaxial deposition process known in the art, such as, for example, RTCVD, LEPD, UHVCVD, APCVD, or MBE.

Figure 21:
FIG. 21 is a cross section view of forming a fifth doped layer, sixth doped layer, seventh doped layer, and an eighth doped layer, according to an embodiment of the present invention.

Referring now to FIG. 21, a cross section view of forming a first diffused layer 2108, a second diffused layer 2110, a third diffused layer 2112, and a fourth diffused layer 2114 is shown 2114, according to an embodiment of the present invention. The first diffused layer 2108 may include a same dopant as a dopant in the first doped layer 810 and the second doped layer 812. The second diffused layer 2110 may include a same dopant as a dopant in the fifth doped layer 1920. The third diffused layer 2112 may include a same dopant as a dopant in the third doped layer 814 and the fourth doped layer 816. The fourth diffused layer 2114 may include a same dopant as a dopant in the sixth doped layer 2020. The first diffused layer 2108, the second diffused layer 2110, the third diffused layer 2112, and the fourth diffused layer 2114 may be formed by any diffusing process known in the art, such as, for example, rapid thermal annealing (RTA).

Figure 22:
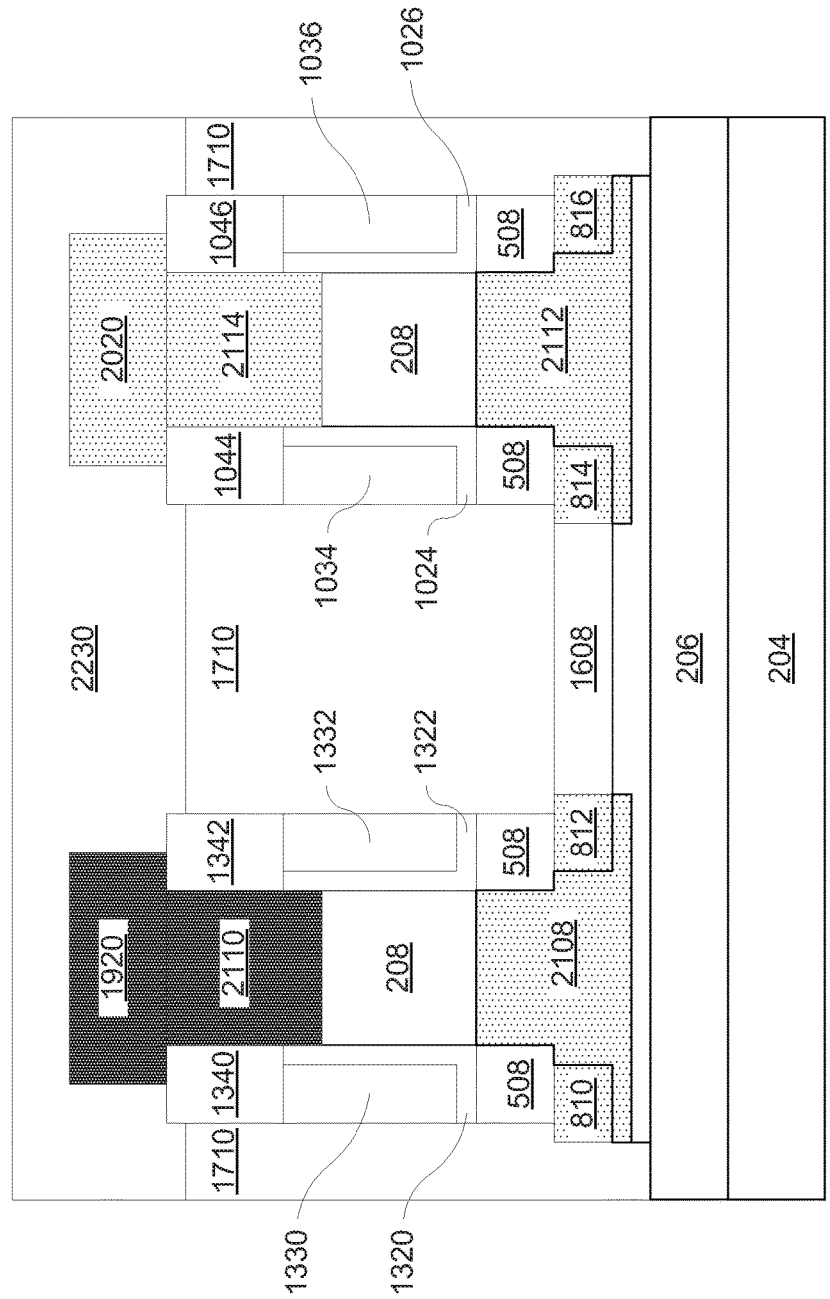
FIG. 22 is a cross section view of forming a third dielectric layer, according to an embodiment of the present invention.

Referring now to FIG. 22, a cross section view of forming a third dielectric layer 2230 is shown, according to an embodiment of the present invention. The third dielectric layer 2230 may be formed over the second dielectric layer 1710, the fifth doped layer 1920, and the sixth doped layer 2020. The third dielectric layer 2230 may be composed of a dielectric material, such as, for example, silicon oxide, silicon nitride, silicon oxynitride, SiBCN, SiOCN, or a combination of dielectric materials. The third dielectric layer 2230 may be formed using a conventional deposition technique, such as, for example, CVD, PVD, PECVD, MBD, PLD, ALD, LSMCD, or spin on deposition. In an embodiment, an excess portion (not shown) of the third dielectric layer 2230 may be removed by a conventional planarization method, such as, for example, chemical mechanical planarization (CMP).

Figure 23:
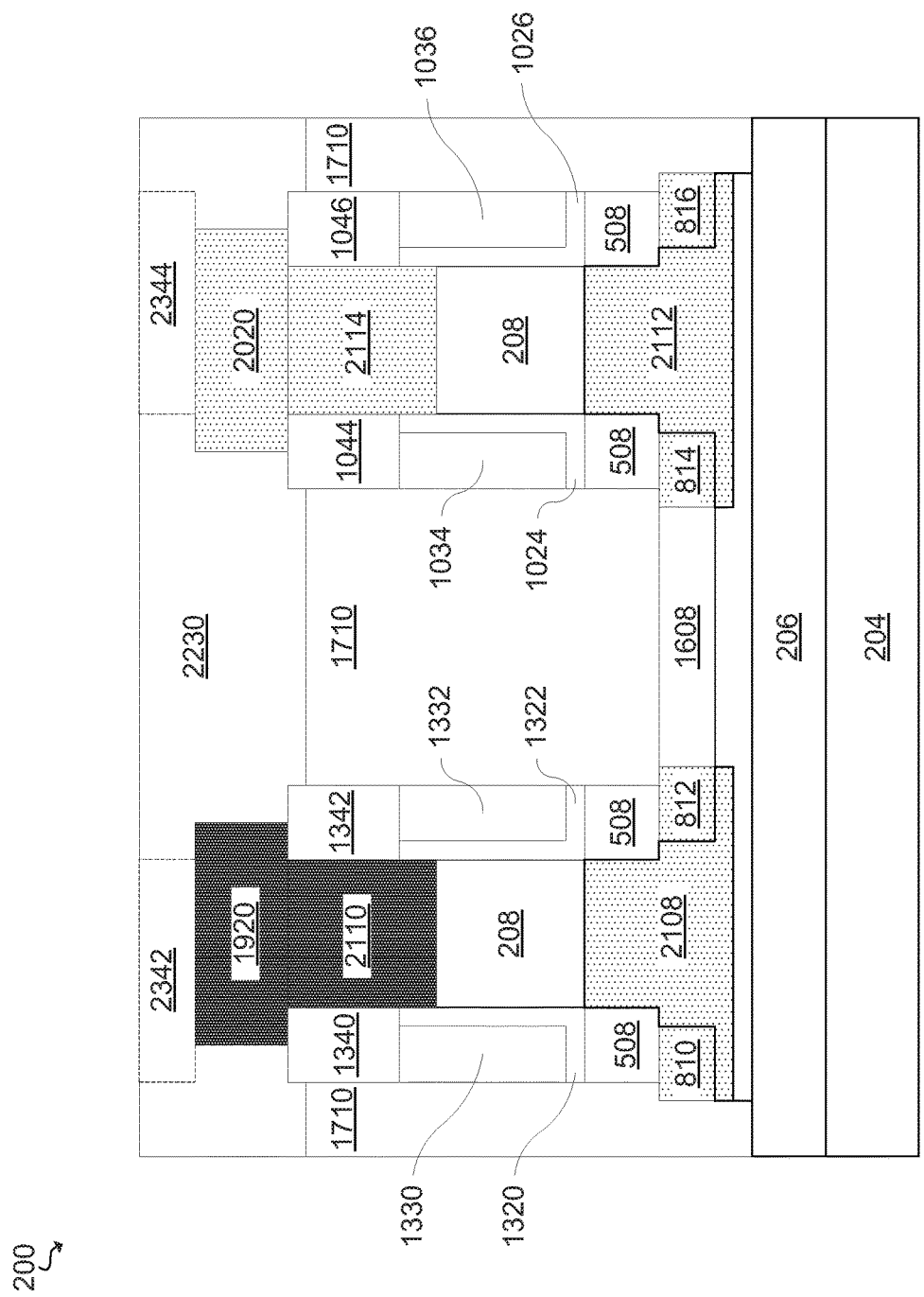
FIG. 23 is a cross section view of removing a portion of the third dielectric layer, according to an embodiment of the present invention.

Referring now to FIG. 23, a cross section view of removing a portion 2342 of the third dielectric layer 2230 and a portion 2244 of the third dielectric layer 2230 is shown, according to an embodiment of the present invention. The portion 2342 and the portion 2244 may be removed using any conventional etching process, such as, for example, RIE.

Figure 24:
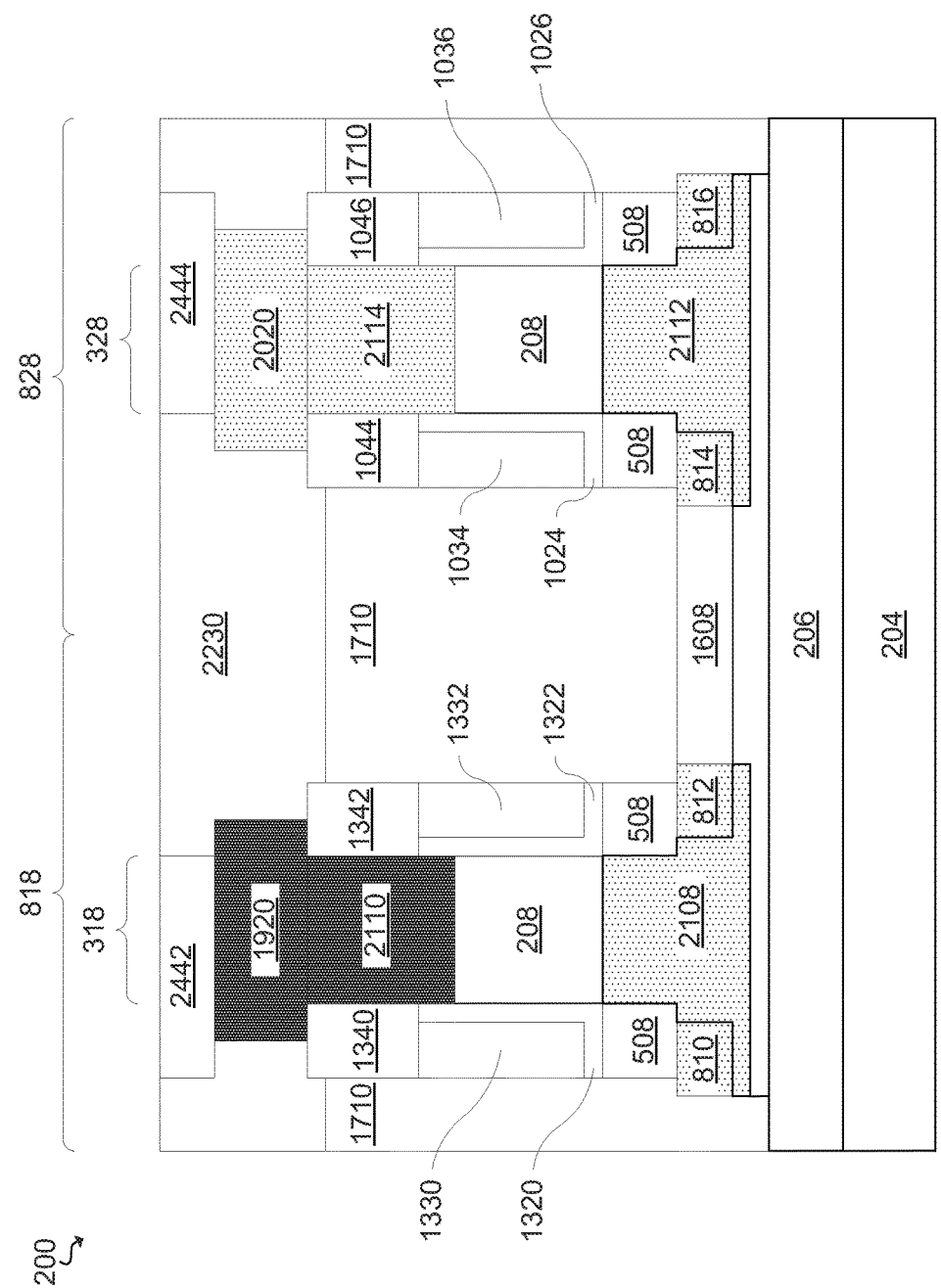
FIG. 24 is a cross section view of forming a second conductive layer on the third doped layer and a third conductive layer on the fourth doped layer, according to an embodiment of the present invention.

Referring now to FIG. 24, a cross section view of forming a second conductive layer 2442 on the fifth doped layer 1920 and a third conductive layer 2444 on the sixth doped layer 2020 is shown, according to an embodiment of the present invention. The second conductive layer 2442 may be used as a common return path for electrical current (i.e. a ground). The third conductive layer 2444 may serve as an interconnect for electrical output. The second conductive layer 2442 and the third conductive layer 2444 may be composed of a conductive material, such as, for example, tungsten, copper, or a combination of conductive materials. The second conductive layer 2442 and the third conductive layer 2444 may be formed using a conventional deposition technique, such as, for example, CVD, PVD, PECVD, MBD, PLD, ALD, LSMCD, or spin on deposition.

Referring now to FIGS. 2-24, a method for forming the structure 200 comprising a FET (e.g. a metal oxide semiconductor field-effect transistor) device electrically connected to a TFET device is shown, according to an embodiment of the present invention. The FET device may include the first fin 318 and the conventional gate stack. The TFET device may include the second fin 328 and the tunnel gate stack. The second dielectric layer 1710 and the third dielectric layer 2230 may electrically isolate one or more components of the structure 200. For example, a middle portion of the second dielectric layer 1710 may isolate a FET device from a TFET device, In another example, the third dielectric layer 2230 may isolate the second conductive layer 2442 from the third conductive layer 2444.

In an embodiment, a voltage may be applied to the second conductive layer 2442 and a signal output may be transmitted by the third conductive layer 2444. A voltage may be applied to the second conductive layer 2442 resulting in a voltage on the fifth doped layer 1920. If a voltage is applied to the conventional gate stack, charge carriers (i.e. electrons or holes) may travel across the first fin 318 (e.g. including the second diffused layer 2110, the semiconductor layer 208, and the first diffused layer 2108). Charge carriers may travel from the first fin 318 to the second doped layer 812 (i.e. a source/drain), across the first conductive layer 1608, and to the third doped layer 814 (i.e. a source/drain). If a voltage is applied to the tunnel gate stack, charge carriers may travel across the second fin 328 (e.g. including the third diffused layer 2112, the semiconductor layer 208, and the fourth diffused layer 2114). Charge carriers may travel from the second fin 328, across the sixth doped layer 2020, and to the third conductive layer 2444. Charge carriers may leave the third conductive layer 2444 to one or more wiring layers in the back end of the line (BOEL) as a signal output.

In an embodiment, the structure 200 may be used as a hybrid amplifier. A voltage may be applied to the third conductive layer 2444 and generate a voltage on the TFET device. If a voltage is applied to the tunnel gate stack and the conventional gate stack, charge carriers may be transmitted from the TFET device directly to the FET device through the first conductive layer 1608. Charge carriers may travel through the first fin 318 of the FET device to the second conductive layer 2442, generating an output. The tunnel gate stack may be electrically isolated from the output due, in part, to a location of the second dielectric layer 1710 and the third dielectric layer 2230. Thus, the TFET may have a high impedance (high Z) input and a high isolation output.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a hybrid circuit, wherein the hybrid circuit comprises a tunnel field effect transistor (TFET) and a metal oxide semiconductor field effect transistor (MOSFET), the method comprising:
    forming a first fin on an upper surface of a substrate in a first active area;
    forming a second fin on an upper surface of the substrate in a second active area;
    forming a first gate stack adjacent to a first sidewall of the first fin and a second sidewall of the first fin, the first gate stack comprising a first gate dielectric in contact with the first fin, a first gate electrode, and a first spacer adjacent to and contacting an upper surface of the first gate electrode;
    forming a second gate stack adjacent to the first sidewall of the second fin and a second sidewall of the second fin, the second gate stack comprising a second gate dielectric in contact with the second fin, a second gate electrode, and a second spacer adjacent to and contacting an upper surface of the second gate electrode;
    forming a first doped layer and a second doped layer adjacent to and contacting a sidewall of the first fin, the first doped layer and the second doped layer having an upper surface below a lower surface of a first gate stack;
    forming a third doped layer and a fourth doped layer adjacent to and contacting the second fin, the third doped layer and the fourth doped layer having an upper surface below a lower surface of a second gate stack;
    forming a fifth doped layer adjacent to and contacting an upper surface of the first fin, a lowest surface of the fifth doped layer being above an uppermost surface of the first gate stack; and
    forming a sixth doped layer adjacent to and contacting an upper surface of the second fin, a lowest surface of the sixth doped layer being above an uppermost surface of the second gate stack;
    forming a dielectric layer between the second gate stack and the fifth doped layer to reduce capacitance between the second gate stack and the fifth doped layer;
    wherein the first active area comprises a TFET;
    wherein the second active area comprises a MOSFET;
    wherein the TFET and the MOSFET are electrically connected.

2. The method of claim 1, wherein the second doped layer is electrically connected to the third doped layer.

3. The method of claim 1, wherein the third doped layer comprises a negative dopant.

4. The method of claim 1, wherein third doped layer comprises a positive dopant.

5. The method of claim 1, wherein the hybrid circuit is a cascode amplifier.

6. The method of claim 1, wherein the MOSFET is electrically connected in series with the TFET.

* * * * *